(12) United States Patent
Matsuya et al.

(10) Patent No.: US 6,924,488 B2
(45) Date of Patent: Aug. 2, 2005

(54) CHARGED-PARTICLE BEAM APPARATUS EQUIPPED WITH ABERRATION CORRECTOR

(75) Inventors: Miyuki Matsuya, Tokyo (JP); Fumio Hosokawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 212 days.

(21) Appl. No.: 10/603,304

(22) Filed: Jun. 25, 2003

(65) Prior Publication Data

US 2004/0036030 A1 Feb. 26, 2004

(30) Foreign Application Priority Data

Jun. 28, 2002 (JP) .................................... 2002-189812

(51) Int. Cl.$^7$ ............................. G21R 5/10; G21K 1/08
(52) U.S. Cl. ................... 250/396 R; 250/310; 250/311; 250/396 ML
(58) Field of Search ................................ 250/310, 311, 250/396 R, 396 ML

(56) References Cited

U.S. PATENT DOCUMENTS

| | | | |
|---|---|---|---|
| 4,962,313 A | * 10/1990 | Rose ........................... | 250/311 |
| 5,084,622 A | 1/1992 | Rose | |
| 6,191,423 B1 | 2/2001 | Krijn et al. | |
| 6,723,997 B2 | * 4/2004 | Matsuya et al. ........ | 250/396 R |
| 6,770,887 B2 | * 8/2004 | Krivanek et al. ....... | 250/396 R |
| 6,852,983 B2 | * 2/2005 | Matsuya et al. ..... | 250/396 ML |

OTHER PUBLICATIONS

Von H. Rose, *OPTIK 33*, Heft 1, 197 pp. 1–24.
Von H. Rose, *OPTIK 34*, Heft 3, 1971, pp. 285–311.
E. Munro et al., "High–resolution, low–energy beams by means of mirror optics", *J. Vac. Sci. Technol.* B 6 (6), Nov./Dec. 1988, pp. 1971–1976.

J. Zach, "Design of a high–resolution low–voltage scanning electron microscope", *OPTIK* 83, No. 1 (1989), pp. 30–40.

H. Rose, "Inhomogeneous Wien filter as a corrector compensating for the chromatic and spherical aberration of low–voltage electron microscopes", *OPTIK* 84, No. 3 (1990), pp. 91–107.

H. Rose, "Outline of a spherically corrected semiaplanatic medium–voltage transmission electron microscope", *OPTIK* 85, No. 1 (1990), pp. 19–24.

Joachim Zach et al., "Aberration correction in a low voltage SEM by a multipole corrector". *Nucl. Instr. and Meth. in Phys. Res. A 363* (1995), pp. 316–325.

* cited by examiner

*Primary Examiner*—John R. Lee
*Assistant Examiner*—Paul M. Gurzo
(74) *Attorney, Agent, or Firm*—The Webb Law Firm

(57) ABSTRACT

A charged-particle beam instrument with an aberration corrector which comprises four stages of electrostatic quadrupole elements, two stages of magnetic quadrupole elements for superimposing a magnetic potential distribution analogous to the electric potential distribution created by the two central quadrupole elements of the four stages of electrostatic quadrupole elements on this electric potential distribution, and four stages of electrostatic octopole elements for superimposing an electric octopole potential on the electric potential distribution created by the four stages of electrostatic quadrupole elements.

15 Claims, 12 Drawing Sheets

CHARGED-PARTICLE BEAM APPARATUS EQUIPPED WITH ABERRATION CORRECTOR

BACKGROUND OF THE INVENTION

1. Field of the Invention

The present invention relates to a charged-particle beam instrument equipped with an aberration corrector. The aberration corrector corrects aberrations, such as chromatic aberration and spherical aberration, in charged-particle beam optics that focus and direct a charged-particle beam at a specimen. The beam is produced in a scanning electron microscope, ion microprobe, or other similar apparatus.

2. Description of Prior Art

In scanning microscopes, transmission electron microscopes, and other apparatus, an aberration corrector is incorporated in the electron optics to enable high-resolution imaging or to enhance the probe current density. A system that corrects chromatic aberration by a combination of electrostatic quadrupole elements and magnetic quadrupole elements and corrects spherical aberration by four stages of octopole elements has been proposed as one example of the above-described aberration corrector. The principle of this system is described in detail in (1) H. Rose, *Optik* 33, Heft 1 (1971) 1–24; (2) J. Zach, *Optik* 83, No. 1 (1989) 30–40; and (3) J. Zach and M. Haider, *Nucl. Instr. and Meth. in Phys. Res.* A363 (1995) 316–325.

The principle of the aforementioned aberration corrector is briefly described by referring to FIG. 1, where the aberration corrector, C, is disposed ahead of an objective lens 7 and behind an objective lens aperture 8. The aberration corrector C is composed of four stages of electrostatic quadrupole elements 1, 2, 3, 4, two stages of magnetic quadrupole elements 5, 6, and four stages of electrostatic octopole elements 11, 12, 13, 14. The two stages of magnetic quadrupole elements 5 and 6 create a magnetic potential distribution analogous to the electric potential distribution created by the second and third stages of the electrostatic quadrupole elements 2 and 3, respectively, and produce a magnetic field superimposed on the electric field. The four stages of electrostatic octopole elements 11–14 produce an electric field superimposed on the electric field produced by the four stages of electrostatic quadrupole elements 1–4.

The first stage of electrostatic quadrupole element 1 and the first stage of electrostatic octopole element 11 are shown to be overlapped. Similarly, the second stage of electrostatic quadrupole element 2, second stage of electrostatic octopole element 12, and first magnetic quadrupole element 5 are shown to be overlapped. Likewise, the third stage of electrostatic quadrupole element 3, third stage of electrostatic octopole element 13, and second magnetic quadrupole element 6 are shown to be overlapped. Also, the fourth stage of electrostatic quadrupole element 4 and fourth stage of electrostatic octopole element 14 are shown to be overlapped.

The instrument further includes a manual input operation-and-display 9, a power supply 10 for the electrostatic quadrupole elements, a power supply 15 for the magnetic quadrupole elements, a power supply 17 for the objective lens, a power supply 18 for the electrostatic octopole elements, and a controller 19. The front focal point of the objective lens 7 is indicated by FFP. The position of the principal plane of the objective lens is indicated by PP.

In this configuration, a charged-particle beam is entered from the left side as viewed in the figure. A standard orbit for the beam is created by the four stages of electrostatic quadrupole elements 1–4 and objective lens 7. The beam is focused onto a surface 20 of the specimen. In this FIG. 1, the X-direction orbit $R_x$ and Y-direction orbit $R_y$ of the beam are schematically drawn on a two-dimensional plane.

The Y-direction orbit $R_y$ is made to pass through the center of the quadrupole element 2 as a paraxial orbit by the quadrupole element 1. The X-direction orbit $R_x$ is made to pass through the center of the quadrupole element 3 by the quadrupole element 2. Finally, the charged-particle beam is focused onto the specimen surface 20 by the quadrupole elements 3, 4, and objective lens 7. This orbit is referred to as the standard orbit. In practice, these need to be adjusted mutually for complete focusing.

The chromatic aberration correction made by the aberration corrector C is next described. Where chromatic aberration is first corrected by the system as shown in FIG. 1, the electric potential $\phi_{q2}$ (V=volts) at the electrostatic quadrupole element 2 and excitation $J_2$ (AT=amp turns) (or magnetic potential) of the magnetic quadrupole element 5 are adjusted such that the standard orbit remains unchanged. As the whole lens system, the X-direction chromatic aberration is corrected to zero. Similarly, the electric potential $\Phi_{q3}$ (V) at the electrostatic quadrupole element 3 and excitation $J_3$ (AT) of the magnetic quadrupole element 6 are adjusted such that the standard orbit remains unchanged. As the whole lens system, the Y-direction chromatic aberration is corrected to zero.

Spherical aberration correction (correction of the third-order aperture aberration) is next described. Where spherical aberration is corrected, X- and Y-direction chromatic aberrations are corrected. Then, the X-direction spherical aberration is corrected to zero over the whole lens system by the electric potential $\phi_{o2}$ (V) at the electrostatic octopole element 12. The Y-direction spherical aberration is corrected to zero by the potential $\phi_{o3}$ (V) at the electrostatic octopole element 13.

Then, spherical aberration in the resultant direction of the X and Y directions is corrected to zero by the electrostatic octopole elements 11 and 14. In practice, mutual and repeated adjustments are necessary. In practical applications, for the potentials at the quadrupole and octopole elements and superimposition of magnetic excitations, a single twelve-pole (dodecapole) element is used, and the potentials and magnetic excitations applied to the poles of the twelve-pole element are varied to synthesize dipoles, quadrupoles, hexapoles, octopoles, and so on. In this way, positive aberration in the objective lens 7 acting as a convex lens is canceled by negative aberration in the aberration corrector C operating as a combination of concave and convex lenses.

Spherical aberration can be corrected if chromatic aberration is not corrected. For example, where the accelerating voltage is high, the effect of chromatic aberration is small compared with spherical aberration. Therefore, only spherical aberration may be corrected.

In the description given below, potential $\phi$ (or voltage) at an electrostatic multipole element indicates the value on the positive (+) side of the multipole element arranged normally as shown in FIGS. 2(a) and 2(b). Similarly, magnetic excitation J (AT) of a magnetic multipole element indicates magnetic excitation on the positive (+) side.

In the aberration corrector C shown in FIG. 1, the above-described theory of aberration correction and the results of actual experiments show that chromatic and spherical aberrations are almost completely corrected. This demonstrates the excellence of the above-described aberration corrector.

The aberration corrector C shown in FIG. 1 is composed of quadrupole and octopole elements. Besides this, there is an aberration corrector composed of hexapole elements for correcting spherical aberration. This is used, for example, on the imaging side (where the specimen image is magnified) of a transmission electron microscope (TEM). Where this aberration corrector composed of hexapole elements is used on the imaging side of a TEM, it is considered to mount a transfer lens system between the objective lens and the aberration corrector to make the coma-free point of the objective lens where coma is zero and the coma-free point of the corrector conjugate with each other to thereby reduce blur due to image distortion and coma. Furthermore, the provision of the transfer lens system makes it possible to secure a physical distance without increasing the optical distance between the objective lens and the aberration corrector.

One aberration corrector has a spherical aberration corrector using two hexapole elements. Where chromatic aberration is corrected, a chromatic aberration corrector is disposed between the hexapole elements as described in (4) H. Rose, *Optik* 84, No. 3 (1990) 91–107.

Methods using two transfer lenses with focal length $f$ are described in (5) H. Rose, *Optik* 85, No. 1 (1990) 19–24 and (6) U.S. Pat. No. 5,084,622.

In the optics shown in these references, let L be the distance between the coma-free position $Z_{OLC}$ in the objective lens and the position $Z_{cc}$ of a coma-free plane in the aberration corrector. It is said that in the case of an imaging system, this coma-free position $Z_{OLC}$ in the objective lens is substantially coincident with the back focal point of the objective lens. The distance L is set equal to $4f(L=4f)$. The distance between the coma-free position $Z_{OLC}$ of the objective lens and the principal plane of the front-stage transfer lens is set to $f$. The distance between the principal plane of the front-stage transfer lens and the principal plane of the rear-stage transfer lens is set to $2f$. The distance between the principal plane of the rear-stage transfer lens and the coma-free position $Z_{cc}$ of the aberration corrector is set to $f$.

As introduced in (7) U.S. Pat. No. 6,191,423, where the distance between the position $Z_{OLC}$ of a coma-free plane in the objective lens and the position $Z_{cc}$ of a coma-free plane in an aberration corrector is set to L, the relation $L=4f$ is set. It is said that in the case of an imaging system, this position $Z_{OLC}$ in the objective lens is substantially coincident with the back focal point of the objective lens. The distance between the position $Z_{OLC}$ of the objective lens and the principal plane of the transfer lens is set to $2f$. The distance between the principal plane of the transfer lens and the position $Z_{cc}$ of the aberration corrector is set to $2f$.

The above-described theory of aberration correction and the results of actual experiments show that chromatic and spherical aberrations are almost completely corrected by the aberration correction method illustrated in FIG. 1. The excellence of the aberration correction system has been demonstrated. However, it can be said that sufficient consideration has not been given to the stability of the aberration correction system, the range of the applied voltage, and optimum conditions from a viewpoint of commercialization. For example, the following problems have arisen.

First, in the configuration shown in FIG. 1, where the accelerating voltage is low, even if the correcting amount produced by the aberration corrector C for correction is somewhat large, the voltage applied to the electrostatic multipole elements, such as quadrupole and octopole elements, is not set high, because the accelerating voltage is low. Therefore, the withstand voltage of the multipole elements will not present problems. However, where the instrumental condition is so varied that the accelerating voltage is varied from low to high state, the correction voltage is, of course, increased compared with the case where the accelerating voltage is low. Accordingly, the voltage applied to the electrostatic multipole elements increases. As a result, there is a danger that the withstand voltage of the elements is exceeded.

In view of this problem, if the instrument is so designed that the withstand voltage of the multipole elements is not exceeded where the accelerating voltage is high, the voltage applied to the multipole elements decreases, as a matter of course, when the accelerating voltage is low. As a result, the instrument is more susceptible to noise introduced in the accelerating voltage and variations in the power-supply voltage. It is more difficult to correct aberration appropriately.

On the other hand, in an instrument where a charged-particle beam is focused and directed at a specimen (e.g., a general-purpose scanning electron microscope or an electron probe apparatus with elemental analysis capabilities), the accelerating voltage needs to be varied from low to high value. Therefore, the above-described phenomenon presents a problem in practical applications.

Secondly, in order to improve the performance further, it is necessary to take account of higher-order aberrations left after correction of chromatic and spherical aberrations, such as fifth-order aperture aberration coefficient C5 (aberration is produced in proportion to the fifth power of the incident angle α of the particle beam to the specimen) and the third-order aperture chromatic aberration coefficient C3c (proportional to the third power of the incident angle α to the specimen and proportional to the energy width of the particle beam) that is a fourth-order aberration coefficient.

Thirdly, in the instrument for directing a focused charged particle beam at a specimen, space for accommodating a deflector and a stigmator is required between the aberration corrector C and the objective lens 7. If this space, or distance, is simply secured, the following problems take place. Aberration is corrected by producing opposite aberration of the same magnitude from the aberration corrector C as aberration on the specimen surface where the corrector C is not operating to correct aberration. If only a space is secured between them, higher-order aberrations, such as C5 and C3c produced by the combination of the aberration in the aberration corrector C and the aberration in the objective lens 7, become larger values. That is, the resultant aberrations of these higher orders increase in proportion to the distance between them.

SUMMARY OF THE INVENTION

In view of the foregoing, the present invention has been made. It is an object of the present invention to provide a charged-particle beam instrument which can perform aberration correction stably and optimally and minimize the diameter of a probe consisting of a charged-particle beam.

A charged-particle beam instrument equipped with an aberration corrector in accordance with the present invention fundamentally comprises: (a) the aberration corrector disposed inside optics of the instrument and having four stages of electrostatic quadrupole elements including two central quadrupole elements and two stages of magnetic quadrupole elements for superimposing a magnetic potential distribution analogous to the electric potential distribution created by the two central quadrupole elements on this electric potential distribution; (b) an objective lens positioned downstream of the aberration corrector and acting to focus the charged-particle beam at a specimen; (c) a transfer lens system consisting of at least one transfer lens located between the aberration corrector and the objective lens and acting to transfer an image plane formed by the aberration corrector to the position of the object plane of the objective lens; (d) four power supplies including a power supply for the four stages of electrostatic quadrupole lenses, a power supply for the two stages of magnetic quadrupole elements, a power supply for the objective lens, and a power supply for the transfer lens system; (e) a manual input operation device for modifying at least one of the accelerating voltage for imparting a given energy to the charged-particle beam and the working distance that is the distance between the objective lens and the specimen; and (f) a controller for controlling the four power supplies according to operation or setting on the manual input operation device.

This instrument is especially characterized in that the transfer lens system consisting of at least one stage of transfer lens is mounted between the aberration corrector and the objective lens and that the resultant magnification of the transfer lens system and objective lens is adjustable at will.

In still another feature of the present invention, there are provided four stages of electrostatic octopole elements for superimposing an octopole electric potential on the electric potential distribution created by the four stages of electrostatic quadrupole elements, a power supply for supplying voltages to the four stages of electrostatic quadrupole elements, and the controller for controlling the power supply for the four stages of electrostatic octopole elements according to operation or setting on the manual input operation device.

The present invention also provides another charged-particle beam instrument which is similar in structure to the above-described instrument except that the transfer lens system is a magnification system or demagnification system.

In particular, where a plane close to the exit point of the aberration corrector is taken as an object plane and a plane close to the front focal point of the objective lens is taken as an image plane, the lens/lenses of the transfer lens system is/are so arranged that the magnification of the transfer lens system is ⅓ to 3 times.

Alternatively, the lens/lenses of the transfer lens system is/are arranged asymmetrically relative to a plane that is vertical to the optical axis and located at the midpoint between the principal plane of the final stage of multipole element of the aberration corrector and the front focal point of the objective lens.

In this configuration, the magnitude (absolute value) of the fifth-order aperture aberration coefficient C5 on the specimen surface or the third-order aperture chromatic aberration coefficient C3c that is a fourth-order aberration is minimized by adjusting the resultant magnification of the transfer lens system and objective lens.

Alternatively, the positions of the transfer lens system and objective lens relative to the aberration corrector are so set that the magnitudes of the X- and Y-direction components $C5_x$ and $C5_y$, respectively, of the fifth-order aperture aberration coefficients C5 on the specimen surface or the magnitudes of the X- and Y-direction components $C3c_x$ and $C3c_y$, respectively, of the aperture chromatic aberration coefficient $C3_c$ that is a fourth-order aperture become comparable with each other.

In yet another feature of the present invention, an electric twelve-pole potential for correcting the fifth-order aberration coefficient is superimposed on the focusing potential, chromatic aberration-correcting potential, and spherical aberration-correcting potential of the multipole elements of the aberration corrector is added to the above-described configuration.

The present invention provides a further charged-particle beam instrument equipped with an aberration corrector, the instrument having a power supply for applying a voltage to the specimen surface. This applied voltage decelerates the charged-particle beam directed at the specimen surface. Consequently, the aberration coefficients obtained prior to aberration correction are reduced.

Other objects and features of the present invention will appear in the course of the description thereof, which follows.

DESCRIPTION OF THE PREFERRED EMBODIMENTS

Figure 5:
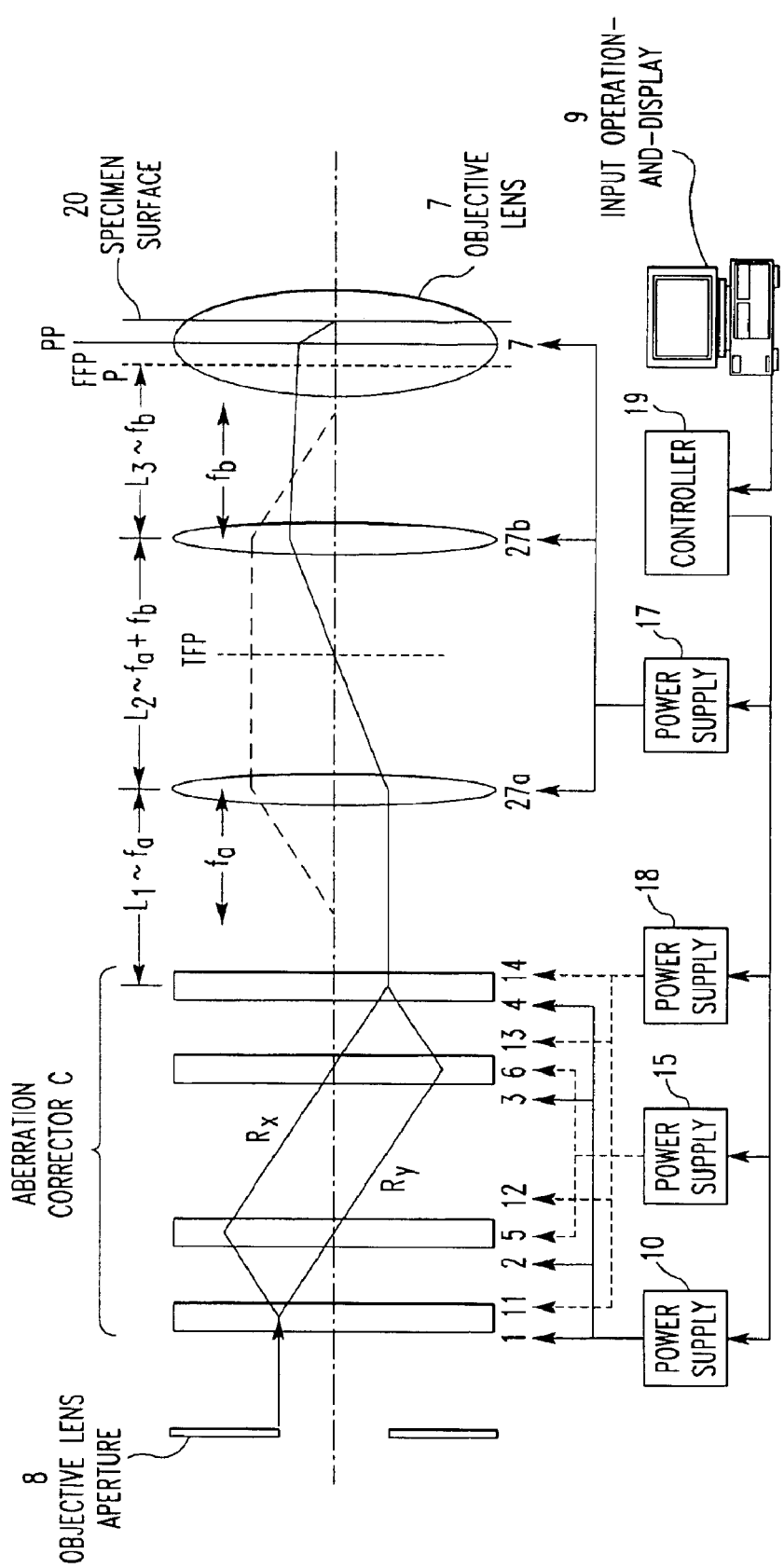
FIG. 5 is a diagram of a charged-particle beam instrument equipped with an aberration corrector where two stages of transfer lenses are disposed according to the first embodiment of the present invention.

The preferred embodiments of the present invention are hereinafter described in detail by referring to the accompanying drawings. FIG. 5 shows the fundamental structure (first embodiment) of the present invention. This is an instrument for shooting a part of a charged-particle beam as a probe at a specimen and comprises four stages of electrostatic quadrupole elements 1, 2, 3, and 4 including two central quadrupole elements 2 and 3, two stages of magnetic quadrupole elements 5 and 6 for superimposing a magnetic potential distribution analogous to the electric potential distribution created by the two central quadrupole elements 2 and 3 on this electric potential distribution, an objective lens 7, transfer lenses 27a and 27b, an objective lens aperture 8 mounted in a part of the optical path, a manual input operation-and-display 9 having a display unit and permitting one to modify the accelerating voltage for imparting a given energy to the charged-particle beam and the working distance that is the distance between the objective lens 7 and a specimen surface 20, a power supply 10 for supplying voltages to the four stages of electrostatic quadrupole elements 1–4, a power supply 15 for exciting the two stages of magnetic quadrupole elements 5 and 6, a power supply 17 for the objective lens and the transfer lenses, and a controller 19 for controlling the power supplies 10, 15, and 17 according to operation or setting performed on the manual input operation-and-display 9.

To correct spherical aberration, four stages of electrostatic octopole elements 11, 12, 13, and 14 for superimposing an electric octopole potential on the electric potential distribution created by the four stages of electrostatic quadrupole elements 1, 2, 3, and 4 and a power supply 18 for supplying voltages to these four stages of electrostatic octopole elements are added to the aforementioned components. The above-described controller 19 also controls the power supply 18 according to operation or setting on the manual input operation-and-display 9.

Figure 12:
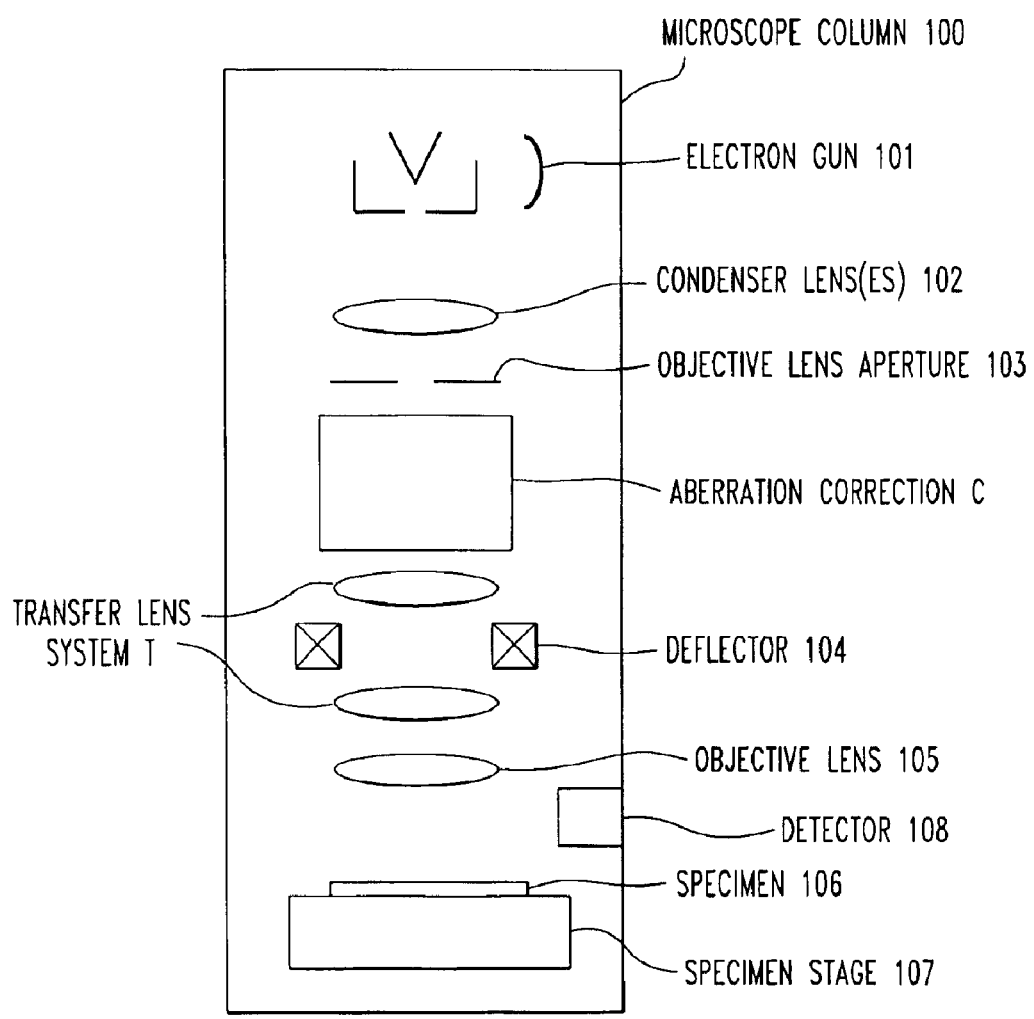
FIG. 12 is a diagram illustrating a scanning electron microscope equipped with an aberration corrector.

This aberration corrector C is incorporated, for example, in a scanning electron microscope (SEM) as shown in FIG. 12. This microscope has a microscope column 100 whose interior is kept in a vacuum environment. Various components are mounted inside the microscope column 100. These components include an electron gun 101 for producing an electron beam and imparting an energy to electrons by an accelerating voltage, a condenser lens system 102 and an objective aperture 103 for limiting the electron beam current produced by the electron gun 101 to an appropriate value, an aberration corrector C, a transfer lens system T, a deflector 104 for deflecting and scanning the electron beam in two dimensions, an objective lens 105 for focusing the electron beam onto a specimen 106, a specimen stage 107 carrying the specimen 106 thereon and capable of driving the specimen 106 at will such that any desired location on the specimen can be irradiated with the scanning electron beam, and a detector 108 for detecting signals, such as secondary electrons produced from the specimen 106, as the specimen is scanned with the beam.

In actual instrumentation, however, the arrangement of the transfer lens system T and deflector 104 does not always agree with the relation shown in this figure. The portion from the electron gun 101 to the objective lens 105 may be referred to as the electron beam optics. Where a decelerating potential is applied to the specimen 106 via the specimen stage 107 to decelerate the electron beam, the portion from the gun 101 to the specimen 106 may be referred to as the electron beam optics.

FIG. 12 shows an example in which the aberration corrector C is incorporated in a SEM. Where the aberration corrector C is incorporated in a transmission electron microscope (TEM) having a function of scanning an electron beam across a specimen in the same way as in an SEM, it should be considered that a lens system for magnifying a TEM image formed by the electron beam transmitted through the specimen 106 shown in FIG. 12 and a fluorescent screen onto which the magnified TEM image is projected are mounted below the specimen stage 107.

The positional relation between the objective lens 7 and the transfer lens system is now described by referring to FIG. 5. It is first assumed that the transfer lens 27a has a focal length (focal distance) of $f_a$ and that the distance $L_1$ between the transfer lens 27a and the principal plane of the electrostatic quadrupole element 4 is approximately $f_a$. It is also assumed that the distance $L_2$ between the transfer lens 27b having a focal length of $f_b$ and the principal plane of the transfer lens 27a is approximately $f_a+f_b$. The objective lens 7 is so arranged that the distance $L_3$ between the principal plane of the transfer lens 27b and the front focal point FFP of the objective lens 7 is approximately $f_b$.

Because of the structure described above, the particle probe is focused onto the specimen surface 20 under control of the power supply 17 for the objective lens 7 and transfer lenses. It is to be noted that the above-described expressions "approximately $f_a$", "approximately $f_a+f_b$", "approximately $f_b$" do not indicate mechanical tolerances but mean that the transfer lenses 27a, 27b, and objective lens 7 can be positioned in such a way that the performance is not affected even if these components are intentionally shifted in position from their respective standard values by about 10% to 20% for convenience in design and fabrication of the instrument.

Figure 1:
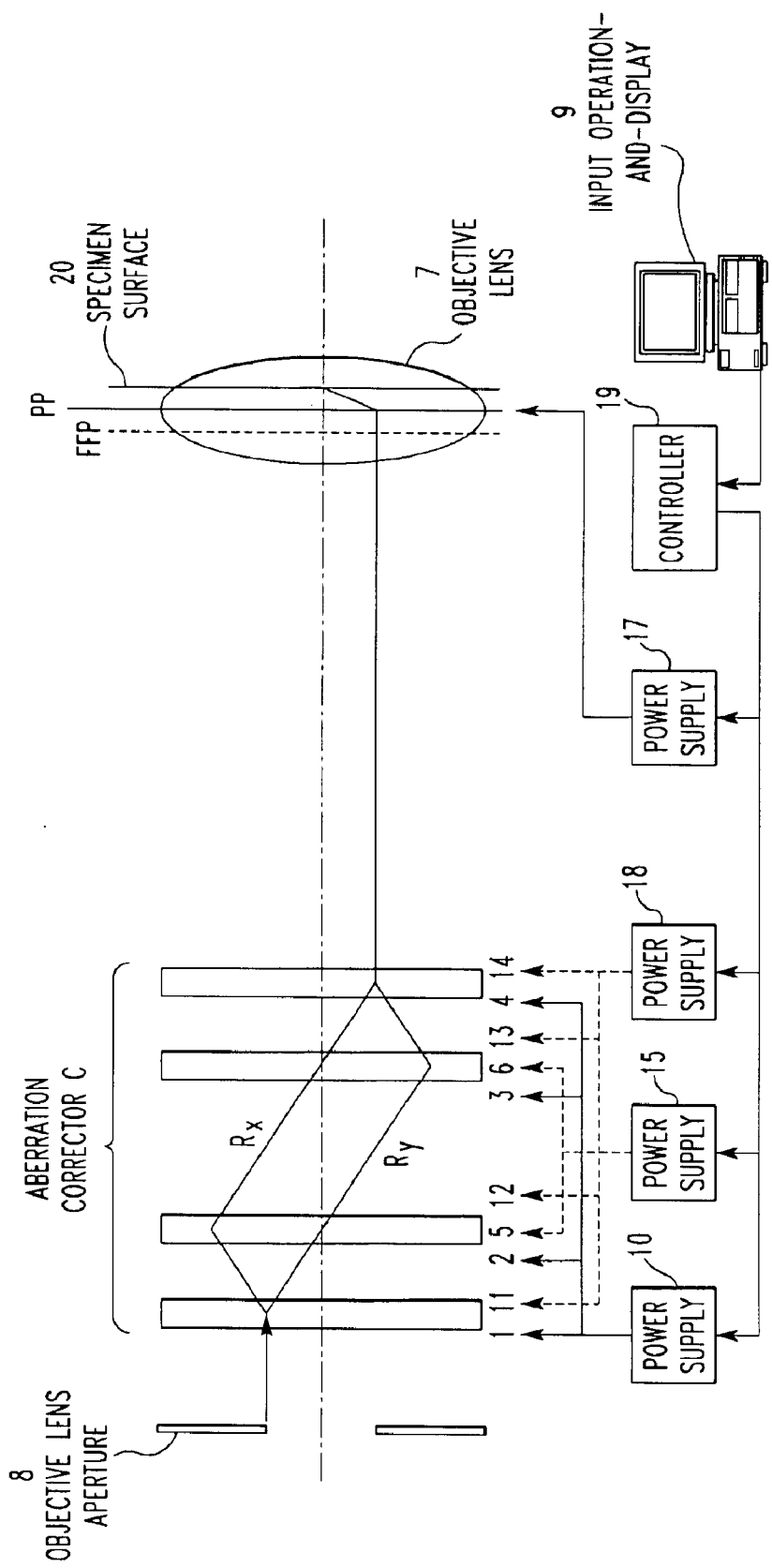
FIG. 1 is a diagram illustrating the principle of an instrument equipped with an aberration corrector for correcting chromatic aberration by a combination of electrostatic quadrupole elements and magnetic quadrupole elements and correcting spherical aberration by four stages of octopole elements according to the prior art.
Figure 2A:
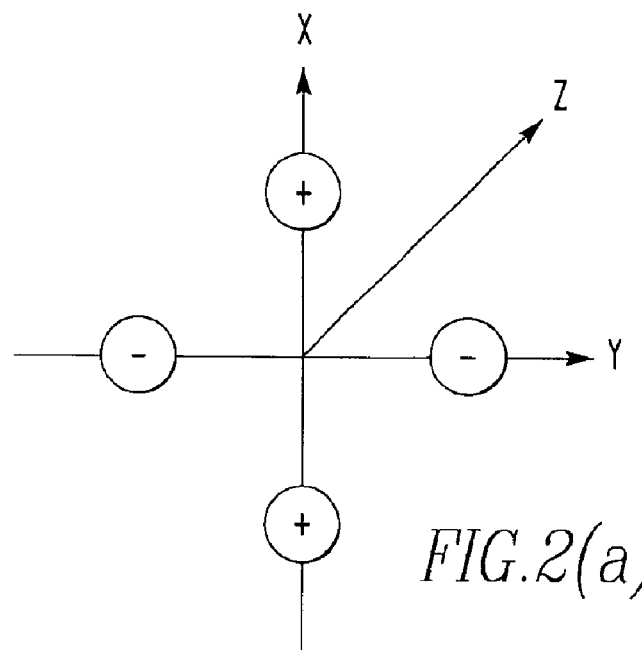
FIGS. 2(a) and 2(b) are diagrams showing normal arrangements of electrostatic quadrupole elements and electrostatic octopole elements.
Figure 2B:
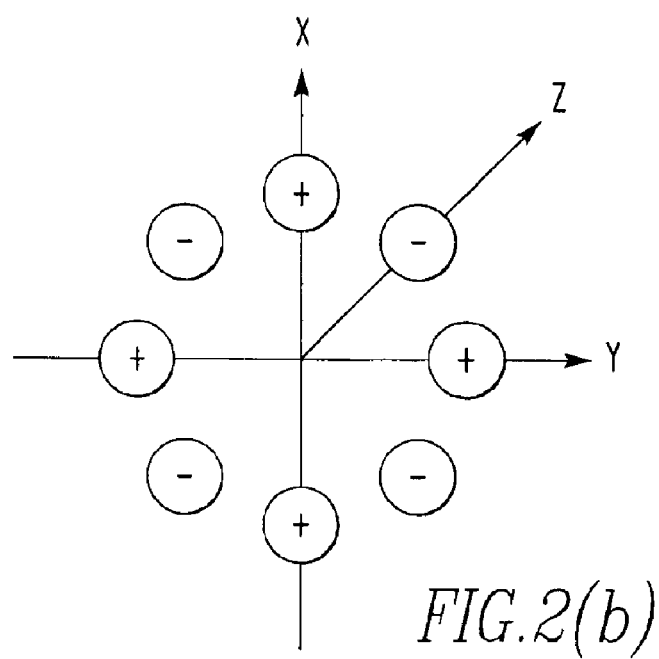
Figure 3:
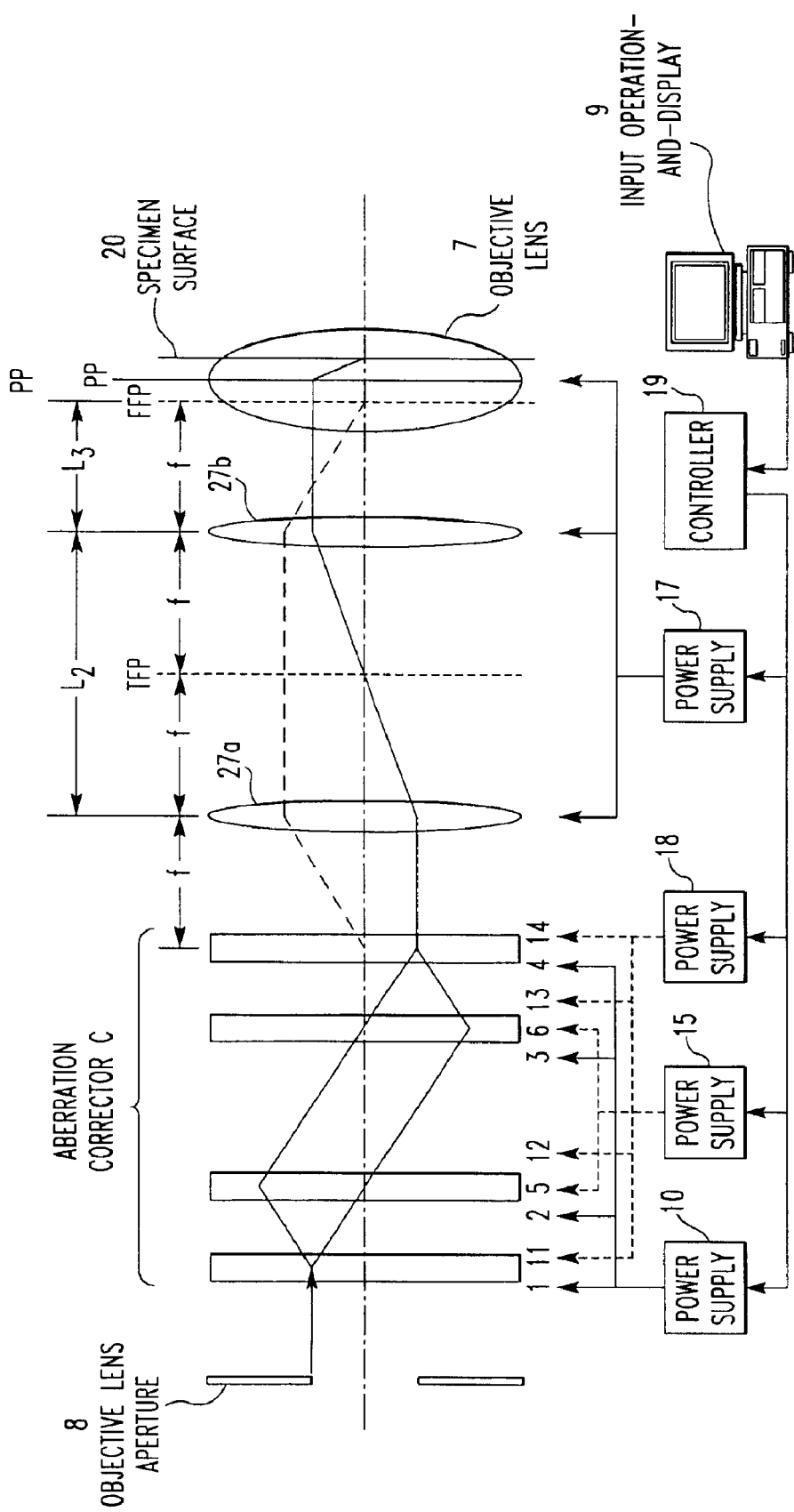
FIG. 3 is a diagram of a charged-particle beam instrument equipped with an aberration corrector where two stages of transfer lenses are disposed as a special case of a first embodiment of the present invention.

It is considered that the transfer lenses can be arranged as shown in FIG. 3 as a special case of the configuration of FIG. 5. In particular, let $f$ be the distance between the transfer lens 27a of focal length $f$ and the principal plane of the electrostatic quadrupole element 4. Similarly, let the distance $L_2$ between the principal plane of the transfer lens 27b of focal length $f$ and the principal plane of the transfer lens 27a be equal to $f+f=2f$. The objective lens 7 is so arranged that the distance $L_3$ between the principal plane of the transfer lens 27b and the front focal point FFP of the objective lens 7 is $f$. In this case, the magnification $M_{TL}$ of the transfer lens system made up of the transfer lenses 27a and 27b is 1 ($M_{TL}=1$).

The arrangement of the transfer lenses shown in FIG. 3 is similar to the arrangement of transfer lenses already described as the prior art in which hexapole elements and transfer lenses are combined and placed on the imaging side (where the specimen image is magnified) of a TEM. In the case of an aberration corrector mounted on the imaging side of a TEM, a TEM image of a specimen has a finite size (area). Therefore, depending on the arrangement of transfer lenses, off-axis image is distorted or blurred due to coma. To reduce such distortion and blur, it is necessary that the relation between the focal length $f$ of the transfer lenses and their arrangement be kept strictly.

On the other hand, we have discovered that in the case of an instrument according to the present invention in which a focused beam is shot at the specimen surface 20, the aforementioned problems do not occur if the relation between the focal length $f$ of each transfer lens and the arrangement does not hold strictly. This finding produces the advantage that the transfer lenses can be arranged at will. Secondly, where the transfer lenses are arranged in a given manner, no problems take place if the magnification of the transfer lens system is varied at will.

However, if the above-described relation deviates excessively, the aberration in the optics increases. Therefore, it would be safe that maximum deviation of the position of the transfer lens system is limited to about 50% of the focal length of the transfer lenses. That is, with respect to the case of FIG. 3, if the position of the transfer lens system is shifted by about 50% of the focal length of the transfer lenses, the achievable magnification of the transfer lens system is about ⅓ to 3 times.

Similarly, limitations are imposed on the magnification of the transfer lens system. First, if the magnification of the lens system is varied, the state of focus of the charged-particle beam on the specimen surface varies. Therefore, it is necessary to adjust the magnification of the objective lens so that the beam is accurately focused onto the specimen surface. Secondly, if the magnification of the transfer lens system is varied, the resultant magnification of the transfer lens and objective lens varies. This varies the correcting amount at the position of the specimen surface. Accordingly, it is necessary to readjust the correcting amount produced by the aberration corrector such that aberration is precisely canceled at the position of the specimen surface. The present invention makes use of these limitations as a useful means for solving the problem rather than treating them as drawbacks.

The operation of the fundamental structure shown in FIG. 5 is hereinafter described by referring to FIG. 6. For simplicity of illustration, it is assumed that the positional relation between the aberration corrector C, transfer lenses 27a, 27b, and objective lens 7 in the configuration shown in FIG. 5 has the following relation to the focal lengths $f_a$ and $f_b$ of the transfer lenses 27a and 27b, respectively, set by controlling the power supply 17 for the objective lens and transfer lenses.

$$L_1 = f_a, L_2 = f_a + f_b, \text{ and } L_3 = f_b \tag{1}$$

That is, this is a special case of the structure shown in FIG. 5.

First, a standard trajectory for the particle beam in the aberration corrector is created by the method already described in the "Prior Art" section of the present specification. That is, as a paraxial trajectory (a trajectory free of aberration), the quadrupole element 1 causes the Y-direction trajectory $R_y$ to pass through the center of the quadrupole element 2. The quadrupole element 2 causes the X-direction trajectory $R_x$ to pass through the center of the quadrupole element 3. The quadrupole elements 3 and 4 bring the positions of the X- and Y-direction image planes of the charged-particle beam exiting from the quadrupole element 4 into agreement with each other. This state is adjusted by focusing the beam in the X- and Y-directions simultaneously.

Then, the aberration corrector is so adjusted that the beam enters the transfer lens 27a in a parallel relation to the optical axis. Thus, the beam exiting from the transfer lens 27a passes through the focal point TFP that is at a distance of $f_a$ from the principal plane of the transfer lens 27a, and then enters the transfer lens 27b. The beam leaving the transfer lens 27b travels parallel to the optical axis and enters the objective lens 7. Note that the beam is not shown to be parallel to the axis because the relation in FIG. 5 is not always the same as the relation of Eq. (1) above.

It is to be understood that the "aberration corrector C is so adjusted that the beam enters the transfer lens 27a in a parallel relation to the optical axis" is not essential. That is, as long as the transfer lens and objective lens are so set that design focal lengths are obtained and the beam is focused in the X- and Y-directions as mentioned previously, the parallel relation is never indispensable. The "parallel" relation is simply quoted to facilitate the understanding of the operation.

The power supply 17 for the objective lens and transfer lenses is then controlled to focus the beam onto the specimen surface 20. The lens action resulting in such a paraxial trajectory is based on an ordinary theory utilizing the prior art method. The magnification $M_{TL}$ of the transfer system where the lenses are arranged to satisfy Eq. (1) is 1 ($M_{TL}$=1) with respect to the conjugate point when $f_a = f_b$. Under this condition, if chromatic and spherical aberrations are corrected, the above-described prior art method or a method described in previously filed U.S. patent application Ser. No. 10/281,378 can be used.

The method described in the previously filed application is now described briefly. In the past, the amount of correction for aberration is adjusted by adjusting electric potentials or magnetic excitations applied to the multipole elements of the aberration corrector C. In the method of the previously filed application, the resultant magnification of the objective lens 7 and a lens or lens system (in the present invention, the transfer lens 27b or both transfer lenses 27b and 27a) located immediately upstream of the objective lens 7 is also adjusted. The range of the correcting amount that can be adjusted can be extended greatly by adjusting the aberration corrector C and the resultant magnification of the objective lens 7 and the lens or lens system very close to it at the same time. In the following description, the prior art method is used.

That is, where chromatic aberration is corrected, the electric potential $\phi_{q2}$ (V) at the electrostatic quadrupole element 2 and excitation $J_2$ (AT) (or magnetic potential) of the magnetic quadrupole element 5 are adjusted such that the above-described standard trajectory remains unchanged. In the whole lens system, the X-direction chromatic aberration is corrected to zero. Similarly, electric potential $\phi_{q3}$ (V) at the electrostatic quadrupole element 3 and magnetic excitation $J_3$ (AT) of the magnetic quadrupole element 6 are adjusted such that the standard trajectory remains unchanged. In the whole lens system, the Y-direction chromatic aberration is corrected to zero.

Then, where spherical aberration is corrected, after chromatic aberration is corrected in the X- and Y-directions, the X-direction spherical aberration is corrected to zero over the whole lens system by the electric potential $\phi_{o2}$ (V) at the electrostatic octopole element 12, and the Y-direction spherical aberration is corrected to zero by the electric potential $\phi_{o3}$ (V) at the electrostatic octopole element 13. Then, spherical aberration in the resultant direction of the X and Y directions is corrected to zero by the electrostatic octopole elements 11 and 14. In practice, mutual and repeated adjustments are necessary.

Thereafter, the focal length $f_{OL}$ of the objective lens 7 and the focal length $f_b$ of the transfer lens 27b are adjusted to vary the total magnifications $M_x$ and $M_y$ of the lens system such that the particle beam is focused onto the specimen surface 20, without varying the control of the aberration corrector C and transfer lens 27a. Chromatic and spherical aberrations are corrected by this novel method of correcting chromatic aberration in an aberration corrector already described in the "Prior Art" section without varying the standard trajectory, by a method of correcting spherical aberration, or by the method described in the above-cited previously filed application.

Figure 6:
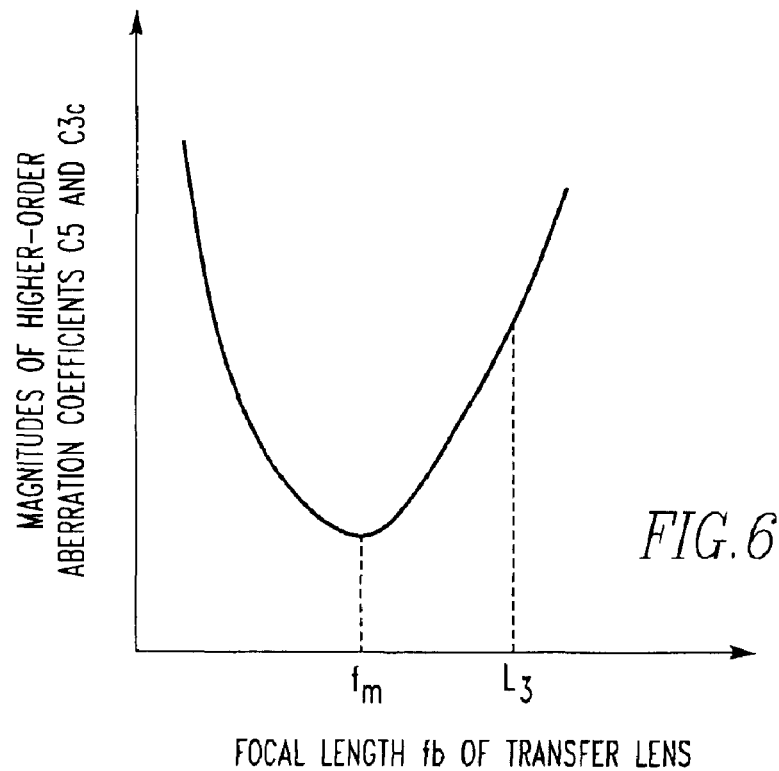
FIG. 6 is a graph in which the magnitudes (absolute values) of the fifth-order aperture aberration coefficient C5 and the third-order aperture chromatic aberration coefficient C3c obtained after correction of chromatic and spherical aberrations are plotted against the focal length $f_b$ of a transfer lens 27b.

Referring to FIG. 6, the fifth-order aperture aberration coefficient C5 and the third-order aperture chromatic aberration coefficient C3c produced after correction of chromatic and spherical aberrations are plotted against the focal length $f_b$ of the transfer lens 27b. In this example, a minimum occurs at $f_m$ where $f_b$ is different from $L_3$. That is, depending on the structure of the aberration corrector C, the operating conditions of the corrector C more greatly contribute to the aberration coefficients C5 and C3c. It is shown that it is not always better to make the vicinities of the principal plane of the aberration corrector conjugate with the front focal point of the objective lens 7.

This means that where the aberration coefficients C5 and C3c should be reduced, the transfer lenses 27a and 27b do not need to have a strict positional relation as shown in FIG. 3 or in the above-cited U.S. Pat. No. 5,084,622 where a positional relation similar to that used in FIG. 3 is employed. Rather, it is better to arrange the transfer lenses 27a and 27b conveniently for the configuration of the instrument and to adjust the focal lengths of the transfer lens 27b and objective lens 7.

As described thus far, the first embodiment of the invention has the feature that the transfer lenses 27a and 27b can be arranged conveniently for the design. Secondly, the focal length of one transfer lens is made variable. Higher-order aberrations can be corrected optimally principally owing to the second feature. Furthermore, the second feature permits the resultant magnification of the transfer lens system and the objective lens to be varied at will. Hence, the correcting amount on the specimen surface can be increased and reduced by adjusting this resultant magnification. Consequently, the range of variation of the voltage applied to each multipole element of the aberration corrector C when the accelerating voltage is varied can be narrowed. The manual input operation-and-display 9 calculates the operating conditions which minimize the aberration coefficient C5 or C3c from probe accelerating voltage $V_a$, working distance WD, and probe current $I_p$ set by the manual input operation-and-display 9. Alternatively, these operating conditions may be previously stored in the manual input operation-and-display 9. The controller 19 sets the aberration corrector C, transfer lens 27b, and objective lens 7 at these operating conditions according to the setting on the manual input operation-and-display 9. The focal length of the transfer lens 27a may be fixed.

In the present fundamental structure, where the length of the whole lens system is limited to a desired value, the distance between the transfer lens 27b and the objective lens 7 is relatively small. Therefore, it is not desirable to place all of the deflector, stigmator, and other components, which should be disposed between the aberration corrector C and the objective lens 7, between the transfer lens 27b and objective lens 7. Accordingly, the deflector is preferably disposed between the transfer lenses 27a and 27b, and the stigmator is placed between the aberration corrector C and the transfer lens 27a.

The fundamental structure (first embodiment) of the present invention has been described by referring to FIGS. 5 and 6. In this embodiment, the arrangement is so set that the focal length of the transfer lens 27a is $f_a$ and that the distance $L_1$ between the principal plane of the fourth stage of quadrupole electrostatic quadrupole element 4 and the principal plane of the transfer lens 27a is also $f_a$.

Figure 7:
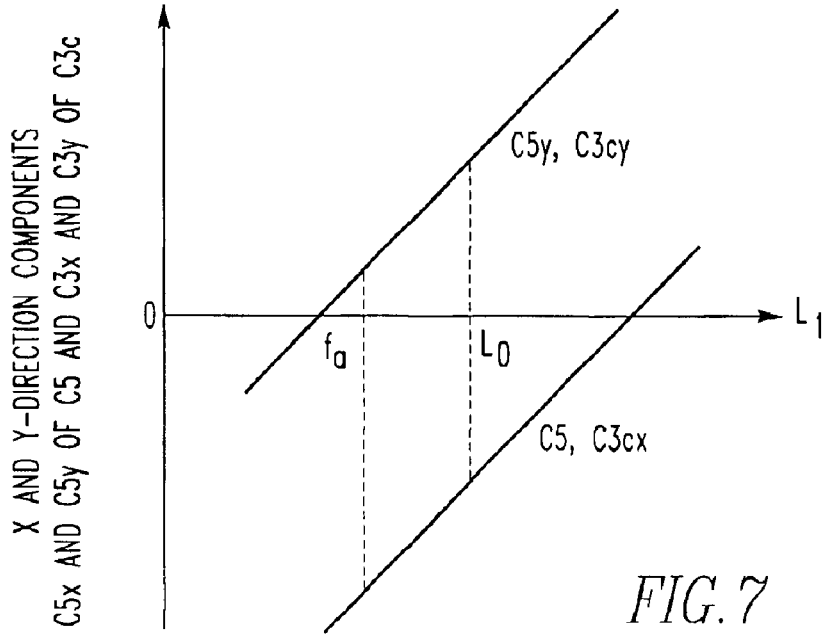
FIG. 7 is a graph in which the X- and Y-direction components $C5_x$ and $C5_y$ of the fifth-order aberration coefficient C5 and the X- and Y-direction components $C3c_x$ and $C3c_y$ of the third-order aberration coefficient C3c are plotted against distance $L_1$.

In the fundamental structure (first embodiment) of the invention illustrated in FIG. 5, however, depending on the operating conditions of the aberration corrector as illustrated in FIG. 7, the position where X- and Y-direction components $C5_x$ and $C5_y$ of the aberration coefficient C5 are equal in magnitude (absolute value) or the X- and Y-direction components $C3c_x$ and $C3c_y$ of the aberration coefficient C3c are equal is not limited to the position where $L_1=f_a$.

Accordingly, where the X- and Y-direction components of the aberration coefficients C5 and C3c cannot be made null at the same time, the operating conditions are so selected that blur of the particle probe is made as symmetrical as possible. That is, blur due to X-component and blur due to Y-component decrease to similar levels. The relation $L_1=L_0$ can be so selected that X- and Y-direction components become comparable to each other. This is used as a second embodiment of the present invention. In practice, it is difficult to make the distance $L_1$ variable. Therefore, the level of $L_0$ is previously found by calculation or experiment and taken as a design distance $L_0$. Furthermore, as shown in FIG. 6, focal length $f_b=f_m$ giving a minimum value may be found, and the relation $L_1=L_0$ may be obtained by setting the distance $L_1$ under this condition.

In the description of the first and second embodiments, the transfer lens system is made up of two stages. Similar advantages can be derived where a single-stage transfer lens system is used. This is described as a third embodiment of the present invention by referring to FIG. 8. This embodiment works on the following two premises.

First, the distance $L_2$ between the transfer lens 27b having the focal length of $f_b$ and the principal plane of the fourth stage of electrostatic quadrupole element 4 is set approximately equal to $2f_b$.

Secondly, the objective lens 7 is so arranged that the distance $L_3$ between the principal plane of the transfer lens 27b and the front focal point FFP of the objective lens 7 is approximately $2f_b$. Under these conditions, the particle beam is focused onto the specimen surface 20 under control of the power supply 17 for the objective lens and transfer lens.

It is to be noted that the above-described expression "approximately $2f_b$" does not indicate mechanical tolerances but means that the transfer lens 27b and objective lens 7 can be positioned in such a way that the performance is not affected even if these components are intentionally shifted in position from their respective standard values by about 10% to 20% for convenience in design and fabrication of the instrument.

Figure 4:
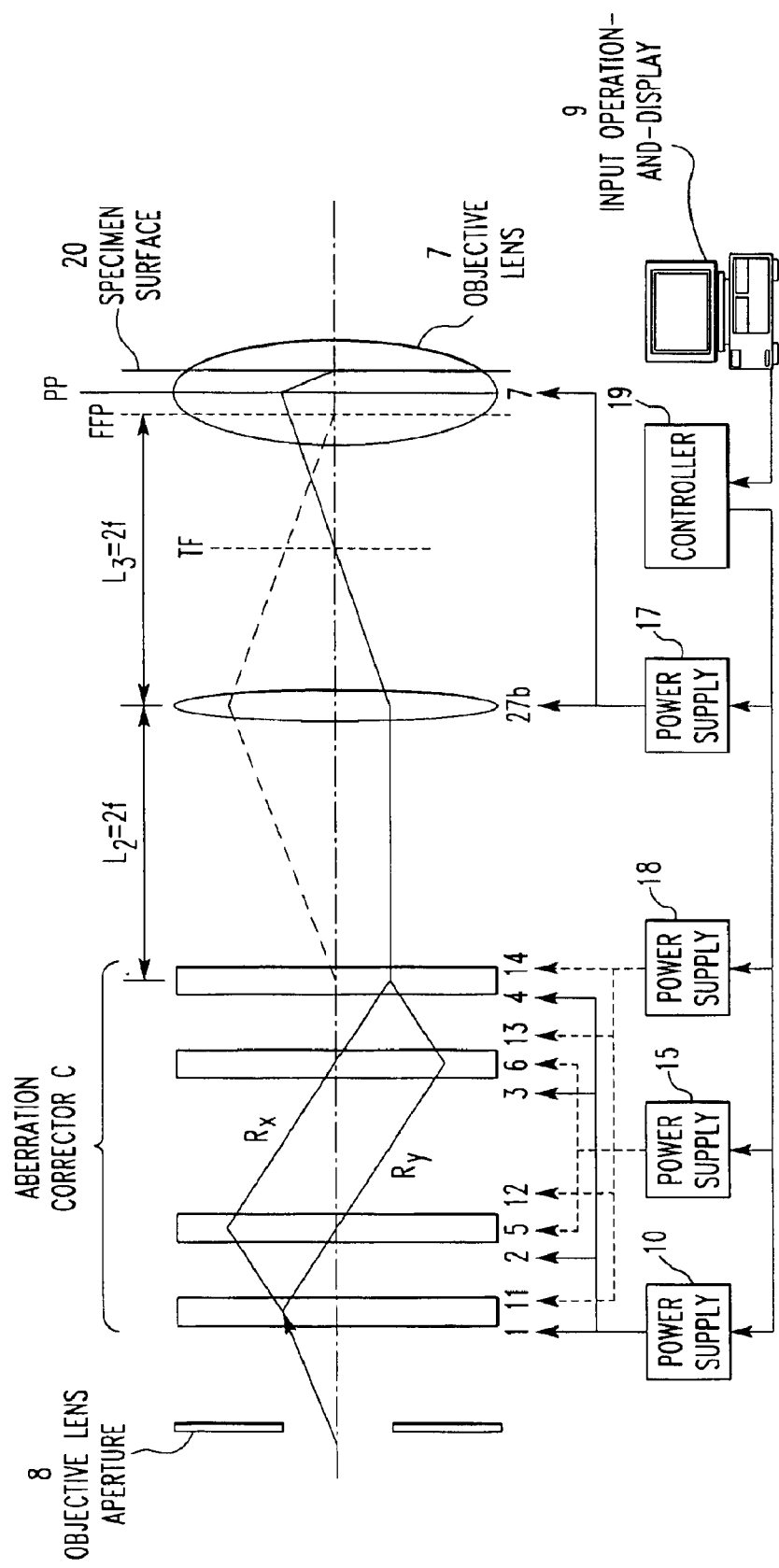
FIG. 4 is a diagram of a charged-particle beam instrument equipped with an aberration corrector where a single stage of transfer lens is disposed as a special case of a third embodiment of the present invention.
Figure 8:
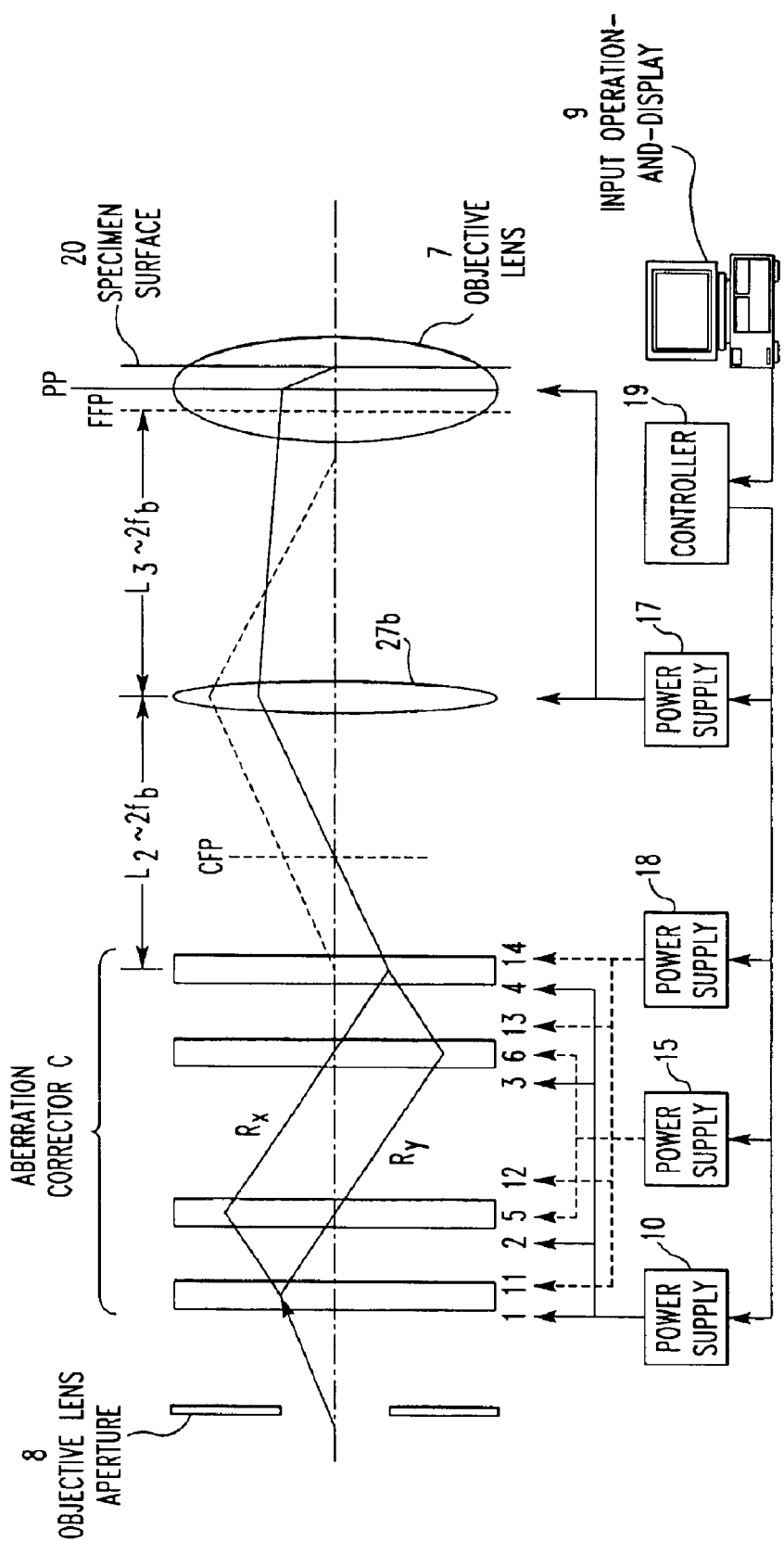
FIG. 8 is a diagram of a charged-particle beam instrument equipped with an aberration corrector where a single stage of transfer lens is disposed according to the third embodiment of the present invention.

As a special case as shown in FIG. 8, arrangement of the transfer lens 27b as shown in FIG. 4 is conceivable. That is, the distance $L_2$ having the focal length of $f$ between the transfer lens 27b and the principal plane of the electrostatic quadrupole element 4 is set to $2f$. Furthermore, the objective lens 7 is so arranged that the distance $L_3$ between the principal plane of the transfer lens 27b and the front focal point FFP of the objective lens 7 is $2f$. In this case, the magnification $M_{TL}$ of the transfer lens system formed by the transfer lens 27b is 1 ($M_{TL}=1$).

Also, in this case, the arrangement of the transfer lens shown in FIG. 4 can be shifted as shown in FIG. 8. However, for the reason described above, it would be safe that maximum deviation of the position of the transfer lens is limited to approximately the focal length of the transfer lens. That is, in the case of FIG. 4, if the position of the transfer lens is shifted by a distance approximately equal to the focal length of the transfer lens, achievable magnification of the transfer lens system is about ⅓ to 3 times.

The operating principle for minimizing higher-order aberration coefficients is next described by referring to FIG. 8 while making a comparison with the prior art concept. For simplicity of illustration, the positional relation between the aberration corrector C, transfer lens 27b, and objective lens 7 is so set that the following relations hold:

$$L_2 = 2f_b, L_3 = 2f_b \quad (2)$$

where $f_b$ is the focal length of the transfer lens 27b set by controlling the power supply 17 for the objective lens and transfer lens.

First, the standard trajectory for the particle beam in the aberration corrector is created by a method as already described in the "Prior Art" section. Then, the aberration corrector C is so adjusted that the beam incident on the transfer lens 27b passes through a point CFP on the optical axis. The point CFP is shifted distanced from the principal plane of the transfer lens 27b toward the aberration corrector. That is, the focal point of the aberration corrector lies at the point CFP. As a result, the beam going out of the transfer lens 27b travels parallel to the optical axis and enters the objective lens 7. Note that the beam is not shown to be parallel to the axis because the relation shown in FIG. 8 is not always the same as the relation given by Eq. (2) above.

Then, the power supply 17 for the objective lens and transfer lens is controlled to focus the beam onto the specimen surface 20. The lens action resulting in such a paraxial trajectory is based on an ordinary theory utilizing the prior art method. The magnification $M_{TL}$ of the transfer lens system with respect to the conjugate point is 1 ($M_{TL}=1$) in this case. Under this condition, if chromatic and spherical aberrations are corrected, the above-described prior art method or the method described in the above-cited previously filed application can be used.

The focal length $f_{OL}$ of the objective lens 7 and the focal length $f_b$ of the transfer lens 27b are then adjusted to vary the total magnifications $M_x$ and $M_y$ of the lens system without modifying the focal condition in which the particle beam is focused onto the specimen surface 20. Chromatic and spherical aberrations are corrected by the method of correcting chromatic aberration in an aberration corrector already described in the "Prior Art" section without varying this novel reference trajectory, by a method of correcting spherical aberration, or by the method described in the above-cited previously filed application.

The fifth-order aperture aberration coefficient C5 and the third-order aperture chromatic aberration coefficient C3c obtained after correction of chromatic and spherical aberrations are plotted against the focal length $f_b$ of the transfer lens 27b. Similarly to the results shown in FIG. 6, a minimum occurs at $f_m$ where $f_b$ is different from $L_3$. That is, depending on the structure of the aberration corrector C, the operating conditions of the corrector C more greatly contribute to the aberration coefficients C5 and C3c. It is shown that it is not always necessary to make the vicinities of the principal plane of the aberration corrector C conjugate with the front focal point of the objective lens 7.

This means that where the aberration coefficients C5 and C3c should be reduced, the transfer lens 27b does not need to have a strict positional relation as shown in FIG. 4. Rather, it is better to arrange the transfer lens 27b conveniently for the configuration of the instrument and to adjust the focal lengths of the transfer lens 27b and objective lens 7.

Supplementarily speaking, $f_a$ shown in FIG. 7 indicates the focal length of the transfer lens 27a adjacent to the aberration corrector C. In FIG. 8, the lens 27a does not exist and so the focal length of the transfer lens 27b is shown. That is, in the third embodiment shown in FIG. 8, $f_a$ of FIG. 7 corresponds to $f_b$ of FIG. 8, and the distance $L_1$ of FIG. 7 corresponds to $L_2$ of FIG. 8.

As described thus far, in the first, second, and third embodiments of the present invention, the aberration corrector C, the transfer lens 27b, and the objective lens 7 are set at the operating conditions which minimize the aberration coefficients C5 or C3c calculated by, or stored in, the manual input operation-and-display 9 from accelerating voltage $V_a$, working distance WD, and probe current $I_p$ set by the manual input operation-and-display 9.

In the configuration shown in the third embodiment of the present invention, where the length of the whole lens system is limited to a given length, the distance between the transfer lens 27b and the objective lens 7 is relatively small. Therefore, if it is impossible to incorporate all of the deflector, stigmator, and other components in this space, the space between the aberration corrector C and transfer lens 27b is used to accommodate these components.

Figure 9:
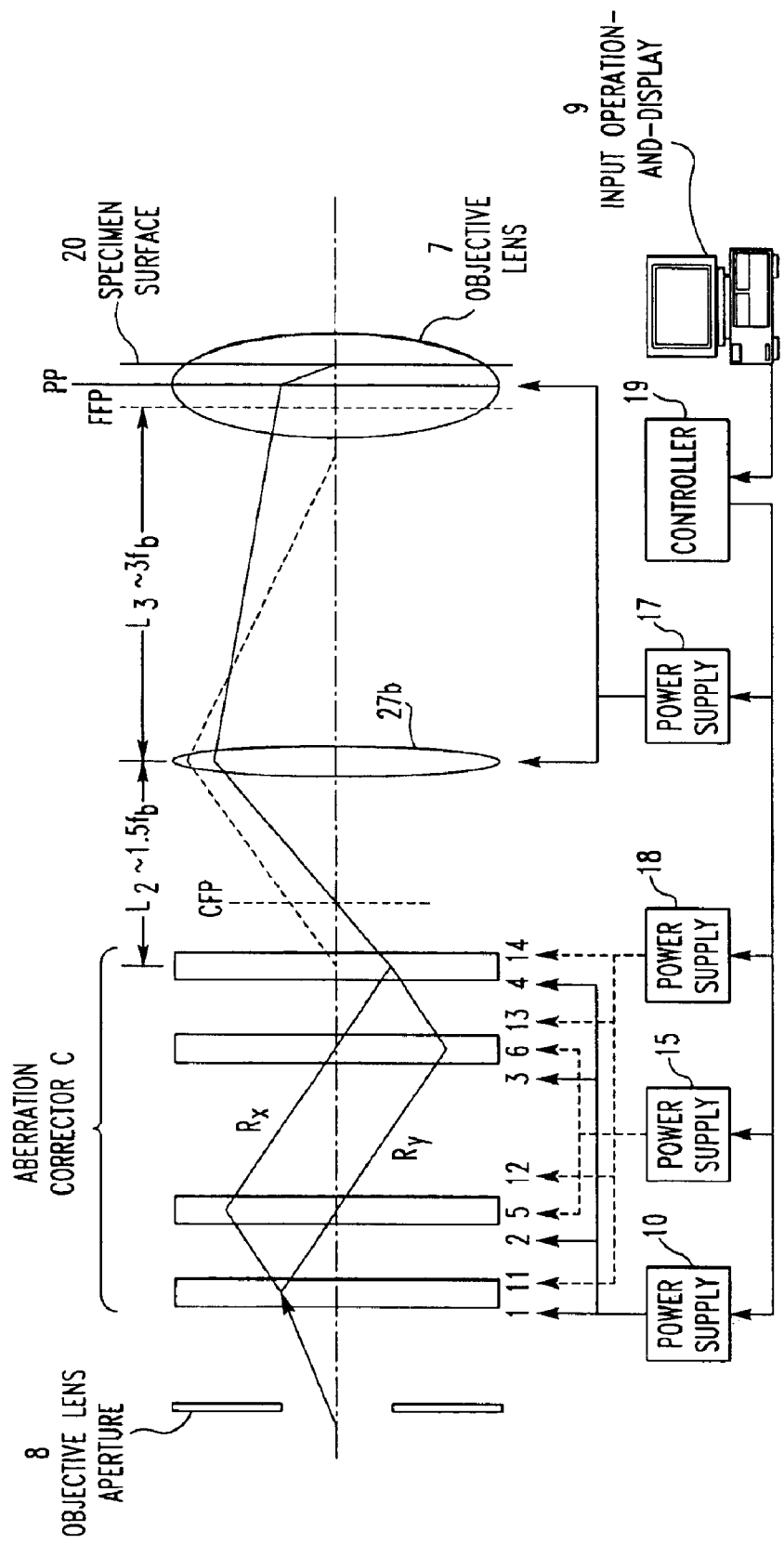
FIG. 9 is a diagram of a charged-particle beam instrument equipped with an aberration corrector where a single stage of transfer lens is arranged asymmetrically according to a fourth embodiment of the present invention.

In the discussed structure of the embodiments already described in connection with FIGS. 5–8, the magnification $M_{TL}$ with respect to the conjugate point of the transfer lens system is close to 1. Other magnifications can also be achieved as in a fourth embodiment of the present invention as illustrated in FIG. 9. In this case, the distance $L_2$ between the transfer lens 27b and the principal plane of the fourth stage of electrostatic quadrupole element 4 having the focal length $f_b$ is set approximately equal to $1.5f_b$. The objective lens 7 is so arranged that the distance $L_3$ between the principal plane of the transfer lens 27b and the front focal point FFP of the objective lens 7 is approximately $3f_b$. The particle probe is focused onto the specimen surface 20 by controlling the power supply 17 for the objective lens and transfer lens.

It is to be noted that the above-described expressions "approximately $1.5f_b$ and $3f_b$" do not indicate mechanical tolerances but mean that the transfer lens 27b and objective lens 7 can be positioned in such a way that the performance is not affected even if these components are intentionally shifted in position from their respective standard values by about 10% to 20% for convenience in design and fabrication of the instrument.

The operating principle for minimizing higher-order aberration coefficients is next described by referring to FIG. 9 while making a comparison with the prior art concept. For simplicity of illustration, it is assumed that the aberration corrector C and the objective lens 7 are arranged relative to the transfer lens 27b whose position is set by controlling the power supply 17 for the objective lens and transfer lens such that the following relations hold:

$$L_2 = 1.5f_b, L_3 = 3f_b \quad (3)$$

That is, this is a special case of the structure shown in FIG. 9.

First, a standard trajectory for the particle beam in the aberration corrector C is created by the method already described in the "Prior Art" section of this specification or by the method described in the above-cited previously filed application. Then, the aberration corrector C is so adjusted that the beam incident on the transfer lens 27b passes through a point CFP on the optical axis. The point CFP is shifted a distance of $f_b$ from the principal plane of the transfer lens 27b toward the aberration corrector. That is, the focal point of the aberration corrector C is set at the point CFP.

As a result, the beam going out of the transfer lens 27*b* travels parallel to the optical axis and enters the objective lens 7. Note that the beam is not shown to be parallel to the axis because the relation shown in FIG. 9 does not always the same as the relation given by Eq. (3). Then, the power supply 17 for the objective lens and transfer lens is controlled to focus the beam onto the specimen surface 20. In this case, the magnification $M_{TL}$ of the transfer lens system with respect to the conjugate point is two times. Under this condition, the fifth-order aperture aberration coefficient C5 and third-order aperture chromatic aberration coefficient C3*c* produced after correction of chromatic and spherical aberrations can be minimized, in the same way as in the third embodiment already described in connection with FIG. 8.

In the fourth embodiment, the distances $L_2$ and $L_3$ which result in $1<M_{TL}$ are used and so the aberration coefficients C5 and C3*c* are increased compared with the third embodiment. However, where this transfer lens is used, the aberration coefficients C5 and C3*c* may be decreased compared with an instrument where the transfer lens 27*b* does not exist and the distance between the aberration corrector C and objective lens 7 is $L_2+L_3$ or $4f$, although this may be affected by the magnitude of $L_2+L_3$ or $4f$. Furthermore, deflector and stigmator can be positioned in the space between the transfer lens 27*b* and objective lens 7 with desirable results.

In the description of FIGS. 8 and 9, the image plane CFP of the aberration corrector C exists between the aberration corrector C and the transfer lens 27*b*. Obviously, this may also be positioned at TF between the transfer lens 27*b* and objective lens 7 as shown in FIG. 4.

Figure 13:
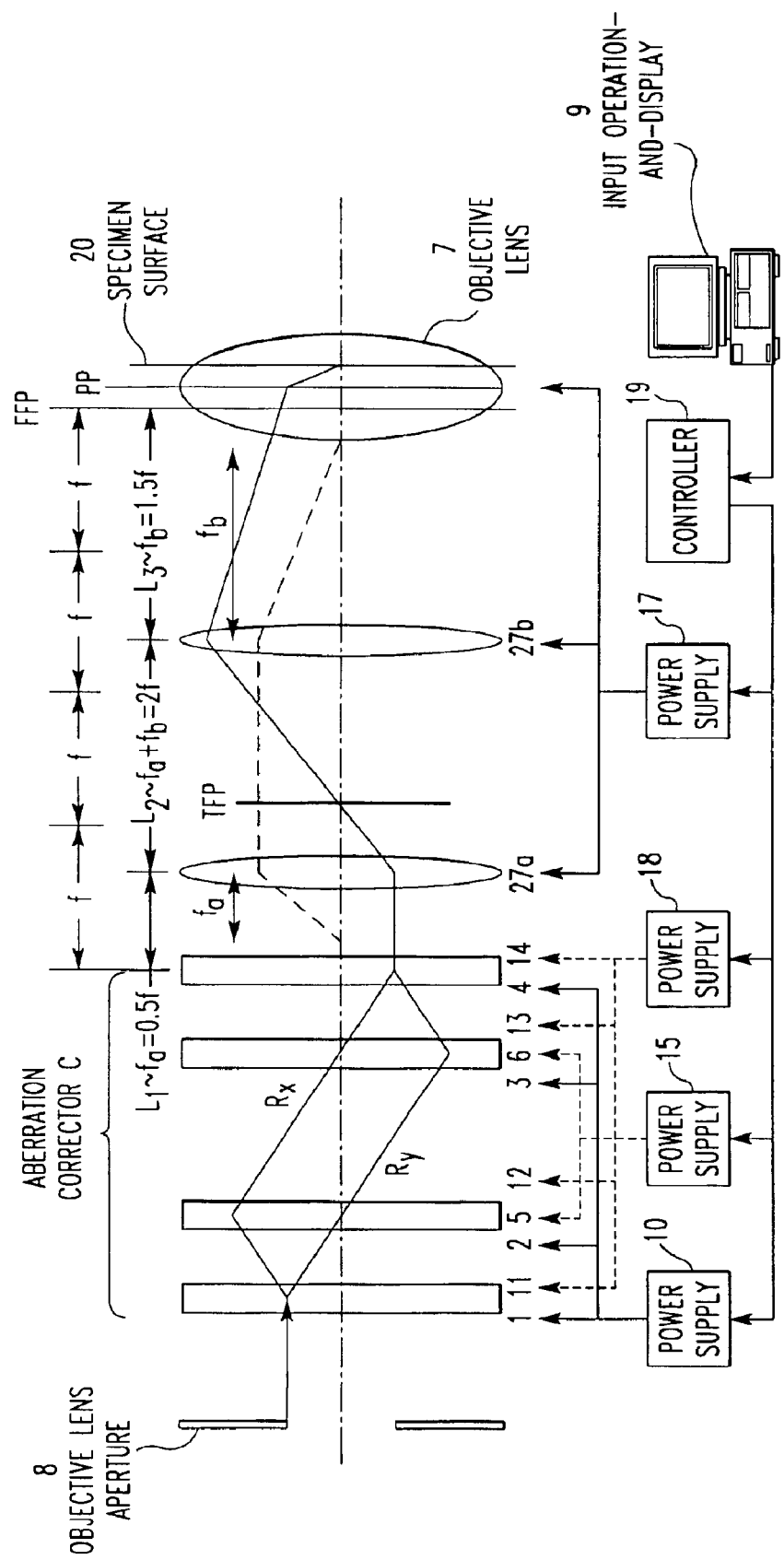
FIG. 13 is a diagram of another charged-particle beam instrument equipped with an aberration corrector where a two-stage transfer lens system according to the fifth embodiment of the present invention is arranged asymmetrically.

A fifth embodiment where the magnification of a transfer lens system consisting of two stages of transfer lenses can be set to other than 1 (unity) is next described by referring to FIG. 13. Where the distance between the exit point of the aberration corrector C and the front focal point of the objective lens 7 is set to $4f$, the distance $L_1$ between the transfer lens 27*a* having a focal length of $f_a$ and the principal plane of the fourth stage of quadrupole element 4 is set approximately equal to $0.5f (f_a=0.5f)$. The distance $L_2$ between the principal plane of the transfer lens 27*b* having a focal length of $f_b$ and the principal plane of the transfer lens 27*a* is set approximately equal to $2f (f_a+f_b=2f)$. The objective lens 7 is so arranged that the distance $L_3$ between the principal plane of the transfer lens 27*b* and the front focal point FFP of the objective lens 7 is set approximately equal to $1.5f$ ($f_b=1.5f$). The particle probe is focused onto the specimen surface 20 under control of the power supply 17 for the objective lens and transfer lenses. At this time, the magnification achieved by the transfer lens system, i.e., the magnification of the transfer lens system at the front focal point of the objective lens 7 with respect to the exit point of the aberration corrector C, is three times.

It is to be noted that the expressions "approximately $0.5f$, $2f$, and $1.5f$" do not indicate mechanical tolerances but mean that the transfer lenses 27*a*, 27*b* and objective lens 7 can be positioned in such a way that the performance is not affected even if these components are intentionally shifted in position from their respective standard values by about 10% to 20% for convenience in design and fabrication of the instrument.

The operating principle for minimizing higher-order aberration coefficients is next described by referring to FIG. 13 while making a comparison with the prior art concept. For simplicity of illustration, the aberration corrector C and the power supply 17 for the objective lens and transfer lenses are arranged relative to the transfer lenses 27*a* and 27*b* whose positions have been set by controlling the power supply 17 such that the following relations hold:

$$L_1=0.5f, L_2=2f, \text{ and } L_3=1.5f \quad (4)$$

That is, this is a special case of the structure shown in FIG. 13.

First, a standard trajectory for the particle beam in the aberration corrector C is created by the method already described in the "Prior Art" section or by the method described in the above-cited previously filed application. Then, the aberration corrector C is so adjusted that the beam incident on the transfer lens 27*a* travels parallel to the optical axis. Thus, the beam going out of the transfer lens 27*a* passes through a focal point TFP that is at a distance of $0.5f$ from the principal plane of the transfer lens 27*a*, and enters the transfer lens 27*b*. The beam exiting from the transfer lens 27*b* travels parallel to the optical axis and enters the objective lens 7. Note that the beam is not shown to be parallel to the axis because the relation in FIG. 13 is not always the same as the relation given by Eq. (4) above.

Then, the power supply 17 for the objective lens and transfer lenses is controlled to focus the beam onto the specimen surface 20. In this case, the magnification $M_{TL}$ of the transfer lens system with respect to the conjugate point is three times. A method of minimizing the magnitudes of the fifth-order aperture aberration coefficient C5 and the third-order aperture chromatic aberration coefficient C3*c* produced after correction of chromatic and spherical aberrations can be implemented in the same way as in the third embodiment already described in connection with FIG. 8.

In the fifth embodiment, distances $L_1$, $L_2$, and $L_3$ which result in $1<M_{TL}$ are used and so the aberration coefficients C5 and C3*c* are increased as compared with the third embodiment. However, where these transfer lenses are used, aberration coefficients C5 and C3*c* can be reduced as compared with an instrument where none of the transfer lenses 27*a* and 27*b* exist and the distance between the aberration corrector C and objective lens 7 is $L_1+L_2+L_3$ or $4f$, although this may be affected by the magnitude of $L_1+L_2+L_3$ or $4f$. Furthermore, the deflector and stigmator can be positioned in the space between the transfer lenses 27*a* and 27*b* or between the lens 27*b* and objective lens 7 with desirable results.

Figure 10:
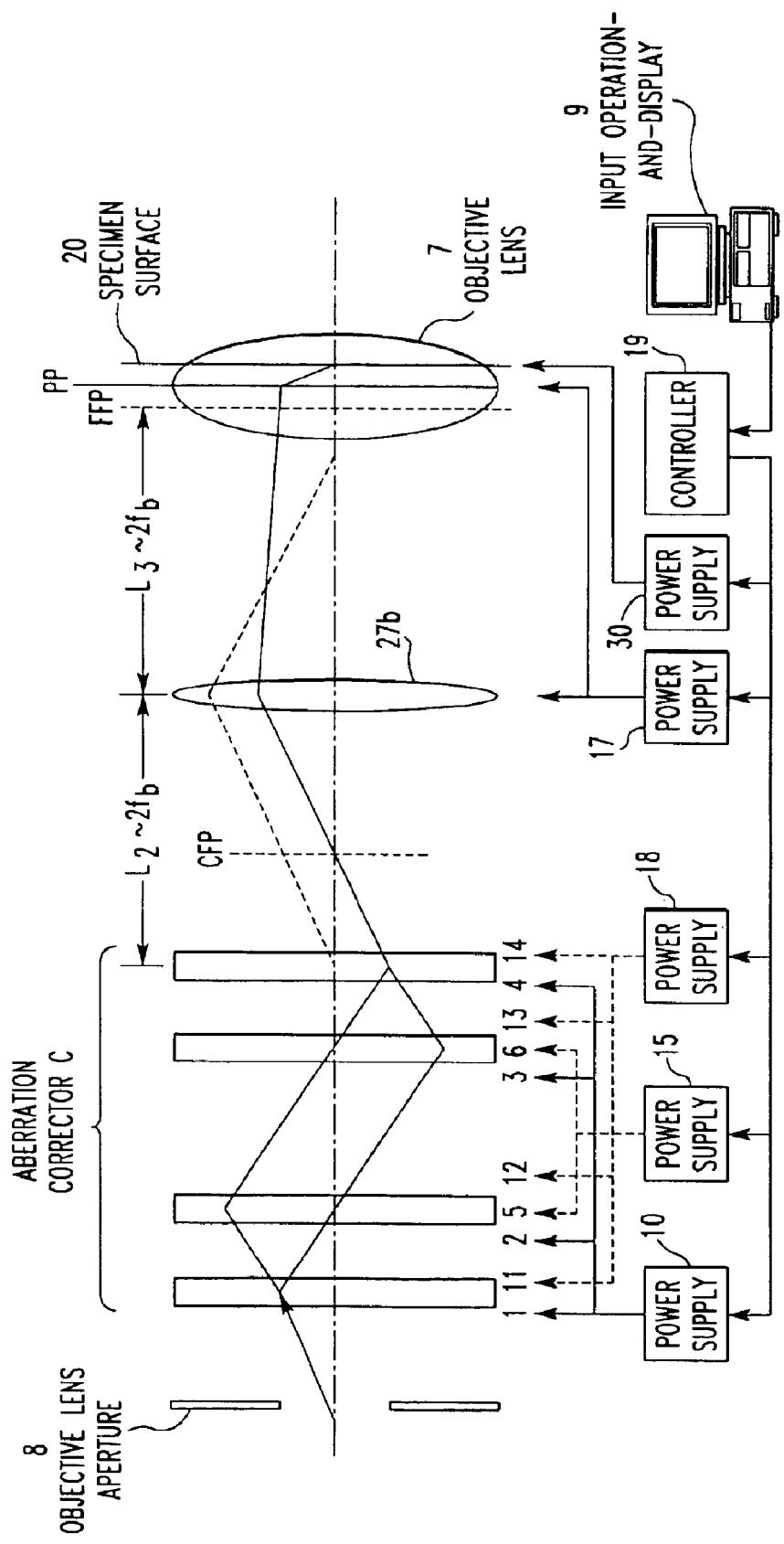
FIG. 10 is a diagram of a charged-particle beam instrument equipped with an aberration corrector according to a sixth embodiment of the present invention, and in which a particle probe directed at a specimen is decelerated.

A sixth embodiment of the present invention is illustrated in FIG. 10. In this embodiment, a structure for applying an electric potential to or close to the specimen surface to decelerate the particle probe incident on the specimen surface 20 is combined with any one of the first through fifth embodiments. In FIG. 10, the structure is combined with the third embodiment as a typical example. The effects of deceleration are described, for example, in the reference: (8) E. Munro et al., *J. Vac. Sci. Technol.* B6(6), November/December (1988) 1971–1976.

This reference explains the most practical example in which chromatic aberration coefficient Cc and spherical aberration coefficient Cs can be attenuated to about 1/4.5 and 1/2.5, respectively, when a voltage is applied to the specimen surface 20 to reduce the incident energy to about one-fourth by the decelerating voltage. It is also shown that when the voltage on the specimen surface 20 is increased to increase the deceleration, the effect becomes more conspicuous.

In the fifth embodiment, a decelerating voltage source 30 is mounted to supply a voltage to or close to the specimen surface to decelerate the particle probe. Using this decelerating voltage and the aforementioned nature, chromatic aberration coefficient Cc and spherical aberration coefficient Cs in the objective lens 7 prior to aberration correction can be reduced.

In consequence, C5 and C3c that are higher-order aberration coefficients produced as resultant aberrations after aberration correction can be suppressed. As an example, simulation shows that where the incident energy is reduced to one-fourth, these aberration coefficients can be reduced to one-fifth to one-tenth.

Accordingly, the higher-order aberration coefficients C5 and C3c produced after aberration correction can be reduced by about two orders of magnitude by using the transfer lens 27b and the present decelerating voltage source 30 as compared with the case where none of them are used. As a result, a reduced probe diameter can be derived.

Figure 11:
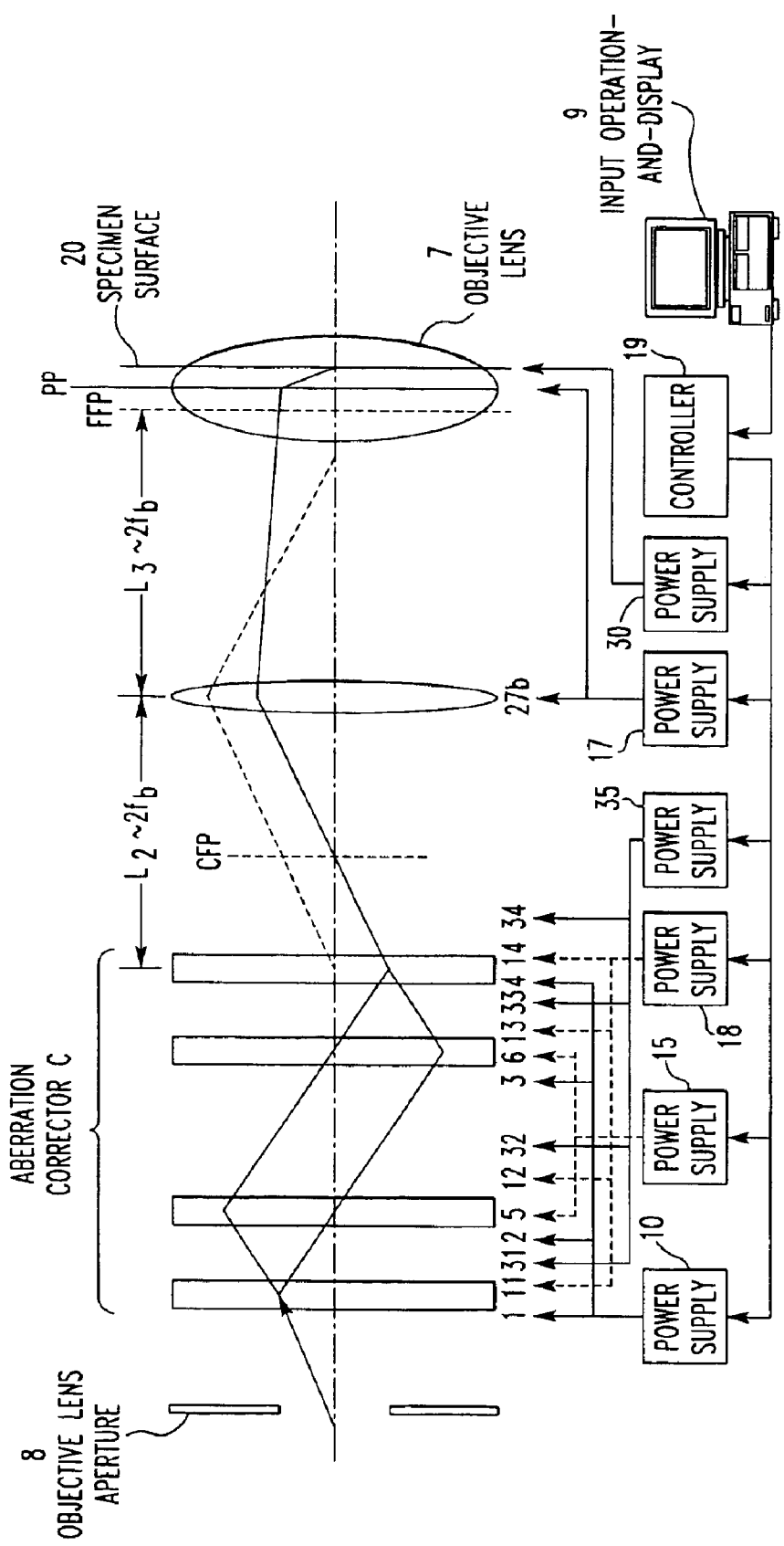
FIG. 11 is a diagram of a charged-particle beam instrument equipped with an aberration corrector where a twelve-pole field is superimposed on electric potentials according to a seventh embodiment of the present invention.

A seventh embodiment of the present invention is shown in FIG. 11. In this embodiment, the effect of the sixth embodiment can be enhanced further. In particular, in the construction of the sixth embodiment shown in FIG. 10, the fifth-order aperture aberration coefficient can be reduced by two orders of magnitude. Where the coefficient is reduced to such a small value, correction of the fifth-order aperture aberration using a twelve-pole (dodecapole) field becomes a reality (e.g., (9) H. Rose, *Optik* 34, Heft 3 (1971) 285–311). Briefly speaking, a quadrupole or octopole field is obtained by synthesizing fields created by a multipole element having twelve or more poles. Therefore, this multipole element having twelve or more poles can be used as a twelve-pole element for the original correction of the fifth-order aperture aberration.

Therefore, the fifth-order aperture aberration can be corrected by the twelve-pole element by connecting a power supply 35 for twelve poles with the twelve-pole elements 31–34 of the first through fourth stages. In this FIG. 11, the first stage of electrostatic quadrupole element 1, first stage of electrostatic octopole element 11, and the first stage of electrostatic twelve-pole element 31 are shown to be overlapped. Similarly, the second stage of electrostatic quadrupole element 2, second stage of electrostatic octopole element 12, first stage of magnetic quadrupole element 5, and second stage of electrostatic twelve-pole element 32 are shown to be overlapped. Also, the third stage of electrostatic quadrupole element 3, third stage of electrostatic octopole element 13, second stage of magnetic quadrupole element 6, and third stage of electrostatic twelve-pole element 33 are shown to be overlapped. Furthermore, the fourth stage of electrostatic quadrupole element 4, fourth stage of electrostatic octopole element 14, and fourth stage of electrostatic twelve-pole element 34 are shown to be overlapped.

This method is hereinafter described. The method of correcting the fifth-order aperture aberration can be implemented similarly to the prior art correction of spherical aberration. That is, adjusting means using the following steps is used as the most fundamental (elementary) method.

In the first step, the X component $C5_x$ of the coefficient C5 is corrected by the second stage of twelve-pole element 32. At this time, the Y-direction trajectory passes through the center of this second stage of twelve-pole element and so the Y-direction component $C5_y$ is hardly affected.

In the next second step, the Y component $C5_y$ of the coefficient C5 is corrected by the third stage of twelve-pole element 33. At this time, the X-direction trajectory passes through the center of this third stage of twelve-pole element 33 and, therefore, the X-direction component $C5_y$ is hardly affected.

In the next third step, the component that is the resultant of the X- and Y-direction components is corrected by the first stage of twelve-pole element 31 and fourth stage of twelve-pole element 34. For example, with respect to the aperture angles $\alpha_x$ and $\alpha_y$ of the particle probe incident on the specimen in the X and Y directions, respectively, the component whose aperture component is in proportion to $\alpha_x^3 \alpha_y^2$ is corrected by the first stage of twelve-pole element 31. The component whose aperture component is in proportion to $\alpha_x^2 \alpha_y^3$ is corrected by the fourth stage of twelve-pole element 34.

The aberration coefficient $C5_x$ proportional to $\alpha_x^5$ and the aberration coefficient $C5_y$ proportional to $\alpha_y^5$ are affected by the correction in the third step. Therefore, in the next fourth step, the adjustments of the first and second steps are repeated. The components proportional to $\alpha_x^3 \alpha_y^2$ and $\alpha_x^2 \alpha_y^3$ are affected by these readjustments. In practice, these mutual adjustments are repeatedly performed.

By repeating the first through fourth steps several times, the fifth-order aberration coefficients can be further reduced to one-hundredths compared with the values produced prior to the aberration correction using the twelve-pole field. This shows that substantially all fifth-order aberration coefficients can be reduced to zero.

Consequently, the effects of the fifth-order aberration coefficient C5 can be removed. Substantially speaking, aberrations that determine the probe diameter are only diffraction aberration and C3c with ideal results. In this way, great advantages can be obtained.

In FIG. 11, the first stage of electrostatic quadrupole element 1 and the first stage of electrostatic octopole element 11 are replaced by an electrostatic twelve-pole element that acts also as the electrostatic twelve-pole element 31. Similarly, the second stage of electrostatic quadrupole element 2, second stage of electrostatic octopole element 12, third stage of electrostatic quadrupole element 3, third stage of electrostatic octopole element 13, fourth stage of electrostatic quadrupole element 4, and fourth stage of electrostatic octopole element 14 are replaced by electrostatic twelve-pole elements which act also as the electrostatic twelve-pole elements 32, 33, 34, respectively. In theory, the power supply 35 can perform the functions of the power supplies 10, 15, and 18. However, in practical applications, the instrument should be designed as if the power supplies 10, 15, and 18 were independent of the power supply 35; otherwise, the above-described adjustments would be quite difficult to perform.

In the above embodiments, a charged-particle beam instrument having both a function of correcting chromatic aberration by an electric-and-magnetic quadrupole field and a function of correcting spherical aberration by an octopole field has been described. However, depending on the characteristics of the instrument to which the aberration corrector of the present invention is applied, any one of the functions of correcting chromatic aberration and correcting spherical aberration, respectively, may be omitted. For example, in an instrument using high accelerating voltages, chromatic aberration is smaller compared with spherical aberration. Sometimes, correction of chromatic aberration may be omitted in practical applications. Similarly, in an instrument using low accelerating voltages, spherical aberration is smaller compared with chromatic aberration. Sometimes, correction of spherical aberration may be omitted in practical situations.

In the case of FIG. 9, the magnification of the transfer lens system is two times. If this magnification is increased further, higher-order aberrations, such as fifth-order aperture aberration coefficient C5, also increase greatly. On the other hand, where the fifth-order aperture aberration coefficient C5 is large, the voltage producing a twelve-pole field increases greatly (e.g., tenfold). Therefore, it is difficult to correct the aberration coefficient C5 by a twelve-pole field.

Even if the coefficient C5 can be successfully corrected, a large aberration-correcting voltage increases the aberration coefficients of the sixth and higher orders (e.g., seventh-order aperture aberration coefficient). If the aperture angles $\alpha_x$ and $\alpha_y$ of the particle probe incident on the specimen are increased in an attempt to reduce diffraction effects, the effects of these aberrations cannot be neglected. This is not a realistic means for obtaining a quite small probe. Accordingly, where higher-order aberrations are taken into consideration, it seems that the practical limit of the magnification at which the transfer lens system is expected to produce advantages is approximately three times.

As described thus far, a charged-particle beam instrument fitted with an aberration corrector in accordance with one embodiment of the present invention fundamentally comprises: (a) the aberration corrector disposed inside the optics of the instrument and having four stages of electrostatic quadrupole elements including two central quadrupole elements and two stages of magnetic quadrupole elements for superimposing a magnetic potential distribution analogous to the electric potential distribution created by the two central quadrupole elements on this electric potential distribution; (b) an objective lens positioned downstream of the aberration corrector and acting to focus the charged-particle beam directed at a specimen; (c) a transfer lens system consisting of at least one stage of transfer lens located between the aberration corrector and the objective lens and acting to transfer an image plane formed by the aberration corrector to the position of the object plane of the objective lens; (d) four power supplies including a power supply for the four stages of electrostatic quadrupole lenses, a power supply for the two stages of magnetic quadrupole elements, a power supply for the objective lens, and a power supply for the transfer lens system; (e) a manual input operation device for modifying at least one of the accelerating voltage for imparting a given energy to the charged-particle beam and the working distance that is the distance between the objective lens and the specimen; and (f) a controller for controlling the four power supplies according to operation or setting on the manual input operation device.

In this system, the transfer lenses of the transfer lens system disposed between the aberration corrector and the objective lens can be arranged relatively arbitrarily. Consequently, more latitude is allowed in arranging the deflector and stigmator between the aberration corrector and objective lens.

Furthermore, the magnification of the transfer lens system can be set relatively arbitrarily and so the resultant magnification of the magnification of the transfer lens system and the magnification of the objective lens can be adjusted without varying the beam focus on the specimen surface. Therefore, where the accelerating voltage is low, an adjustment is made to lower the resultant magnification. The amount of aberration produced by the aberration corrector is prevented from decreasing excessively. This reduces the effects of noise and power-supply variations on the applied voltage. Where the accelerating voltage is high, an adjustment is so made as to increase the resultant magnification. In this way, the problem of the withstand voltage of the multipole elements is alleviated.

Furthermore, the magnification of the transfer lens system can be set relatively arbitrarily. Consequently, higher-order aberrations remaining after correction of chromatic and spherical aberrations, such as fifth-order aperture aberration coefficient C5 and third-order aperture chromatic aberration coefficient C3c that is the fourth-order aberration, can be optimally corrected. The probe diameter of the charged-particle beam hitting the specimen surface can be minimized.

In addition, the positions of the transfer lens system and objective lens relative to the aberration corrector are so set that the X- and Y-direction components $C5_x$ and $C5_y$ of the fifth-order aberration coefficient or the X- and Y-direction components $C3c_x$ and $C3c_y$ of the aperture chromatic aberration coefficient C3c that is the fourth-order aberration are made comparable with each other. As a consequence, the symmetry of the probe diameter of the charged-particle beam hitting the specimen surface is enhanced. The diameter of the probe can be reduced to a minimum.

Further, a twelve-pole potential for correcting the fifth-order aberration coefficient is superimposed on focusing potential, chromatic aberration-correcting potential, and spherical aberration-correcting potential for the multipole elements of the aberration corrector. Because of this structure, the fifth-order aperture aberration coefficient can be substantially reduced down to zero. The diameter of the probe of the charged-particle beam directed at the specimen surface can be reduced to a minimum.

Still further, there is provided a power supply for applying a voltage to the specimen surface. The application of the voltage decelerates the charged-particle beam hitting the specimen surface. In this way, the aberration coefficients obtained prior to aberration correction are reduced. Consequently, higher-order aberration coefficients C5 and C3c can be reduced by a factor of 5 to 10. The diameter of the probe of the charged-particle beam hitting the specimen surface can be reduced to a minimum.

Having thus described our invention with the detail and particularity required by the Patent Laws, what is desired protected by Letters Patent is set forth in the following claims.

The invention claimed is:

1. A charged-particle beam instrument equipped with an aberration corrector and adapted to focus a charged-particle beam onto a specimen, said instrument comprising:

said aberration corrector disposed inside optics of the instrument and having four stages of electrostatic quadrupole elements including two central quadrupole elements and two stages of magnetic quadrupole elements for superimposing a magnetic potential distribution analogous to an electric potential distribution created by said two central quadrupole elements on this electric potential distribution;

a power supply for supplying voltages to said four stages of electrostatic quadrupole elements and a power supply for supplying currents to said two stages of magnetic quadrupole elements;

an objective lens positioned downstream of the aberration corrector and acting to focus the charged-particle beam directed at the specimen;

a power supply for said objective lens;

a transfer lens system consisting of at least one stage of transfer lens located between the aberration corrector and the objective lens and acting to transfer an image plane formed by the aberration corrector to the position of the object plane of the objective lens;

a power supply for the transfer lens system;

a manual input operation device for modifying at least one of an accelerating voltage for imparting a given energy to said charged-particle beam and a working distance that is the distance between the objective lens and the specimen; and a controller for controlling the power supply for the four stages of electrostatic quadrupole elements, the power supply for the two stages of magnetic quadrupole elements, the power supply for the objective lens, and the power supply for the transfer lens system according to operation or setting on the manual input operation device.

2. A charged-particle beam instrument equipped with an aberration corrector as set forth in claim 1, wherein the resultant magnification of the transfer lens system and the objective lens is made adjustable.

3. A charged-particle beam instrument equipped with an aberration corrector as set forth in claim 2, further comprising four stages of electrostatic octopole elements for superimposing an electric octopole potential on the electric potential distribution created by said four stages of electrostatic quadrupole elements and a power supply for supplying voltages to said four stages of electrostatic octopole elements, and wherein said controller controls said power supply for the four stages of octopole elements according to operation or setting on the manual input operation device.

4. A charged-particle beam instrument equipped with an aberration corrector as set forth in claim 3, wherein said transfer lens system is a magnification system or a demagnification system.

5. A charged-particle beam instrument equipped with an aberration corrector as set forth in claim 4, wherein the transfer lens system is placed in such a position that when an object plane of said transfer lens system is set close to a final stage of said aberration corrector and an image plane conjugate with this object plane is set close to a front focal point of the objective lens, the magnification of said transfer lens system with respect to the conjugate point is one-third to three times.

6. A charged-particle beam instrument equipped with an aberration corrector as set forth in claim 3, wherein said transfer lens system is placed asymmetrically with respect to a plane which extends vertical to the optical axis and is located at the midpoint between a principal plane of a final stage of multipole element of said aberration corrector and a front focal point of the objective lens.

7. A charged-particle beam instrument equipped with an aberration corrector as set forth in any one of claims 3 to 6, wherein a resultant magnification of said transfer lens system and said objective lens is adjusted in such a way that fifth-order aperture aberration coefficient C5 at a surface of the specimen or third-order aperture chromatic aberration coefficient C3c that is a fourth-order aberration is minimized in magnitude (absolute value).

8. A charged-particle beam instrument equipped with an aberration corrector as set forth in any one of claims 3 to 6, wherein the positions of the transfer lens system and the objective lens relative to the aberration corrector are so set that the magnitudes of the X- and Y-direction components $C5_x$ and $C5_y$, respectively, of the fifth-order aperture aberration coefficients C5 on the specimen surface or the magnitudes of the X- and Y-direction components $C3c_x$ and $C3c_y$, respectively, of the aperture chromatic aberration coefficient C3c that is the fourth-order aperture become comparable with each other.

9. A charged-particle beam instrument equipped with an aberration corrector as set forth in any one of claims 3 to 6, wherein an electric twelve-pole potential for correcting the fifth-order aberration coefficient is superimposed on the focusing potential, chromatic aberration-correcting potential, and spherical aberration-correcting potential of the multipole elements of the aberration corrector.

10. A charged-particle beam instrument equipped with an aberration corrector as set forth in any one of claims 1 to 6, wherein there is further provided a power supply for applying a voltage to the surface of the specimen to decelerate the charged-particle beam directed at the surface of the specimen, thus reducing aberration coefficients produced prior to aberration correction.

11. A charged-particle beam instrument equipped with an aberration corrector as set forth in any one of claims 1 to 6, wherein said transfer lens system consists of a single stage of transfer lens.

12. A charged-particle beam instrument equipped with an aberration corrector as set forth in any one of claims 1 to 6, wherein said transfer lens system consists of two stages of transfer lenses.

13. A charged-particle beam instrument equipped with an aberration corrector as set forth in claim 1 or 2, wherein said transfer lens system is a magnification system or a demagnification system.

14. A charged-particle beam instrument equipped with an aberration corrector as set forth in claim 13, wherein the transfer lens system is placed in such a position that when an object plane of said transfer lens system is set close to a final stage of said aberration corrector and an image plane conjugate with this object plane is set close to a front focal point of the objective lens, the magnification of said transfer lens system with respect to the conjugate point is one-third to three times.

15. A charged-particle beam instrument equipped with an aberration corrector as set forth in claim 1 or 2, wherein said transfer lens system is placed asymmetrically with respect to a plane which extends vertical to the optical axis and is located at the midpoint between a principal plane of a final stage of multipole element of said aberration corrector and a front focal point of the objective lens.

* * * * *